US011674345B2

(12) United States Patent
Ruiz

(10) Patent No.: US 11,674,345 B2
(45) Date of Patent: Jun. 13, 2023

(54) DOOR ASSEMBLY FOR A TELECOMMUNICATIONS CHASSIS WITH A COMBINATION HINGE STRUCTURE

(71) Applicant: COMMSCOPE, INC. OF NORTH CAROLINA, Hickory, NC (US)

(72) Inventor: Guilibaldo Ruiz, McKinney, TX (US)

(73) Assignee: COMMSCOPE, INC. OF NORTH CAROLINA, Hickory, NC (US)

( * ) Notice: Subject to any disclaimer, the term of this patent is extended or adjusted under 35 U.S.C. 154(b) by 1238 days.

(21) Appl. No.: 16/094,711

(22) PCT Filed: Apr. 17, 2017

(86) PCT No.: PCT/US2017/027915
§ 371 (c)(1),
(2) Date: Oct. 18, 2018

(87) PCT Pub. No.: WO2017/184501
PCT Pub. Date: Oct. 26, 2017

(65) Prior Publication Data
US 2020/0325712 A1 Oct. 15, 2020

Related U.S. Application Data

(60) Provisional application No. 62/324,685, filed on Apr. 19, 2016.

(51) Int. Cl.
*E05D 3/12* (2006.01)
*E05D 11/06* (2006.01)
(Continued)

(52) U.S. Cl.
CPC ............... *E05D 3/12* (2013.01); *E05D 11/06* (2013.01); *H04Q 1/021* (2013.01); *H04Q 1/026* (2013.01);
(Continued)

(58) Field of Classification Search
CPC .. E05D 3/12; E05D 3/18; E05D 11/06; H04Q 1/021; H04Q 1/026; H05K 5/0226
See application file for complete search history.

(56) References Cited

U.S. PATENT DOCUMENTS 2,805,106 A 9/1957 Penkala
2,864,656 A 12/1958 Yorinks
(Continued)

FOREIGN PATENT DOCUMENTS

AU 40995/85 A 4/1985
AU 55314/86 A 3/1986
(Continued)

OTHER PUBLICATIONS

International Search Report and Written Opinion of the International Searching Authority for International Patent Application No. PCT/US2017/027915 dated Jul. 25, 2017, 12 pages.
(Continued)

*Primary Examiner* — Victor D Batson
*Assistant Examiner* — Matthew J Sullivan
(74) *Attorney, Agent, or Firm* — Merchant & Gould P.C.

(57) ABSTRACT

A hinge assembly for pivotally coupling a door to a telecommunications chassis includes a hinge structure configured to attach the door to the telecommunications chassis, the hinge structure defining a door pivot point and a hinge pivot point that is spaced from the door pivot point, wherein a door coupled by the hinge structure to the telecommunications chassis can pivot with respect to the hinge structure independent of a pivoting motion of the hinge structure with respect to the telecommunications chassis, wherein the hinge structure further defines at least a portion of a pivot limiting structure spaced from the hinge pivot point, the portion of the pivot limiting structure defined by the hinge structure being configured to interact with the telecommu-
(Continued)

nications chassis in limiting the pivoting motion of the hinge structure.

10 Claims, 19 Drawing Sheets

(51) Int. Cl.
   *H04Q 1/02* (2006.01)
   *H05K 5/02* (2006.01)

(52) U.S. Cl.
   CPC ........ *H05K 5/0226* (2013.01); *E05Y 2900/20* (2013.01)

(56) References Cited

U.S. PATENT DOCUMENTS

| | | |
|---|---|---|
| 3,901,564 A | 8/1975 | Armstrong |
| 4,070,076 A | 1/1978 | Zwillinger |
| 4,172,625 A | 10/1979 | Swain |
| 4,320,934 A | 3/1982 | Rock et al. |
| 4,359,262 A | 11/1982 | Dolan |
| 4,373,776 A | 2/1983 | Purdy |
| 4,494,806 A | 1/1985 | Williams et al. |
| 4,502,754 A | 3/1985 | Kawa |
| 4,585,303 A | 4/1986 | Pinsard et al. |
| 4,595,255 A | 6/1986 | Bhatt et al. |
| 4,609,171 A | 9/1986 | Matsui |
| 4,630,886 A | 12/1986 | Lauriello et al. |
| 4,697,874 A | 10/1987 | Nozick |
| 4,699,455 A | 10/1987 | Erbe et al. |
| 4,708,430 A | 11/1987 | Donaldson et al. |
| 4,717,231 A | 1/1988 | Dewez et al. |
| 4,737,039 A | 4/1988 | Sekerich |
| 4,765,710 A | 8/1988 | Burmeister et al. |
| 4,792,203 A | 12/1988 | Nelson et al. |
| 4,820,007 A | 4/1989 | Ross et al. |
| 4,840,449 A | 6/1989 | Ghandeharizadeh |
| 4,898,448 A | 2/1990 | Cooper |
| 4,971,421 A | 11/1990 | Ori |
| 4,986,762 A | 1/1991 | Keith |
| 4,995,688 A | 2/1991 | Anton et al. |
| 5,024,498 A | 6/1991 | Becker et al. |
| 5,066,149 A | 11/1991 | Wheeler et al. |
| 5,067,678 A | 11/1991 | Henneberger et al. |
| 5,071,211 A | 12/1991 | Debortoli et al. |
| 5,100,221 A | 3/1992 | Carney et al. |
| 5,127,082 A | 6/1992 | Below et al. |
| 5,129,030 A | 7/1992 | Petrunia |
| 5,138,688 A | 8/1992 | Debortoli |
| 5,142,606 A | 8/1992 | Carney et al. |
| 5,142,607 A | 8/1992 | Petrotta et al. |
| 5,167,001 A | 11/1992 | Debortoli et al. |
| 5,174,675 A | 12/1992 | Martin |
| 5,240,209 A | 8/1993 | Kutsch |
| 5,247,603 A | 9/1993 | Vidacovich et al. |
| 5,275,064 A | 1/1994 | Hobbs |
| 5,285,515 A | 2/1994 | Milanowski et al. |
| 5,289,558 A | 2/1994 | Teichler et al. |
| 5,316,243 A | 5/1994 | Henneberger |
| 5,323,480 A | 6/1994 | Mullaney et al. |
| 5,325,984 A * | 7/1994 | Ady ........................ F16M 13/00 220/817 |
| 5,335,349 A | 8/1994 | Kutsch et al. |
| 5,339,379 A | 8/1994 | Kutsch et al. |
| 5,353,367 A | 10/1994 | Czosnowski et al. |
| 5,363,466 A | 11/1994 | Milanowski et al. |
| 5,363,467 A | 11/1994 | Keith |
| 5,402,515 A | 3/1995 | Vidacovich et al. |
| 5,412,751 A | 5/1995 | Siemon et al. |
| 5,430,823 A | 7/1995 | Dupont et al. |
| 5,438,641 A | 8/1995 | Malacarne |
| 5,490,229 A | 2/1996 | Ghanderharizadeh et al. |
| 5,497,444 A | 3/1996 | Wheeler |
| 5,509,096 A | 4/1996 | Easley |
| 5,511,144 A | 4/1996 | Hawkins et al. |
| 5,530,783 A | 6/1996 | Belopolsky et al. |
| 5,570,450 A | 10/1996 | Fernandez et al. |
| 5,613,030 A | 3/1997 | Hoffer et al. |
| 5,640,481 A | 6/1997 | Llewellyn et al. |
| 5,655,044 A | 8/1997 | Finzel et al. |
| 5,717,810 A | 2/1998 | Wheeler |
| 5,724,469 A | 3/1998 | Orlando |
| 5,802,237 A | 9/1998 | Pulido |
| 5,811,055 A | 9/1998 | Geiger |
| 5,823,646 A | 10/1998 | Arizpe et al. |
| 5,836,148 A | 11/1998 | Fukao |
| 5,845,366 A * | 12/1998 | Kuroda ................ G06F 1/1681 16/229 |
| 5,882,100 A | 3/1999 | Rock |
| 5,887,106 A | 3/1999 | Cheeseman et al. |
| 5,901,415 A * | 5/1999 | Morrison .................. E05D 3/12 16/334 |
| 5,913,352 A | 6/1999 | Scates et al. |
| 5,915,441 A * | 6/1999 | Schlack .................... E05D 3/12 16/334 |
| 5,917,984 A | 6/1999 | Roseler et al. |
| 5,923,753 A | 7/1999 | Haataja et al. |
| 5,946,440 A | 8/1999 | Puetz |
| 5,966,492 A | 10/1999 | Bechamps et al. |
| 5,971,626 A | 10/1999 | Knodell et al. |
| 5,975,769 A | 11/1999 | Larson et al. |
| 5,978,540 A | 11/1999 | Bechamps et al. |
| 6,009,224 A | 12/1999 | Allen |
| 6,022,150 A | 2/2000 | Erdman et al. |
| 6,027,252 A | 2/2000 | Erdman et al. |
| 6,044,194 A | 3/2000 | Meyerhoefer |
| 6,076,908 A | 6/2000 | Maffeo |
| 6,215,938 B1 | 4/2001 | Reitmeier et al. |
| 6,226,436 B1 | 5/2001 | Daoud et al. |
| 6,236,795 B1 | 5/2001 | Rodgers |
| 6,269,214 B1 | 7/2001 | Naudin et al. |
| 6,301,424 B1 | 10/2001 | Hwang |
| 6,360,050 B1 | 3/2002 | Moua et al. |
| 6,377,722 B1 | 4/2002 | Hoekstra |
| 6,438,310 B1 | 8/2002 | Lance et al. |
| 6,439,523 B1 | 8/2002 | Chandler et al. |
| D466,087 S | 11/2002 | Cuny et al. |
| 6,496,638 B1 | 12/2002 | Andersen |
| 6,504,988 B1 | 1/2003 | Trebesch et al. |
| 6,564,428 B2 * | 5/2003 | Richard ................ E05D 11/105 16/335 |
| 6,591,051 B2 | 7/2003 | Solheid et al. |
| 6,594,434 B1 | 7/2003 | Davidson et al. |
| 6,600,866 B2 | 7/2003 | Gatica et al. |
| RE38,311 E | 11/2003 | Burmeister et al. |
| 6,677,520 B1 | 1/2004 | Kim et al. |
| 6,715,619 B2 | 4/2004 | Kim et al. |
| 6,738,555 B1 | 5/2004 | Cooke et al. |
| 6,748,155 B2 | 6/2004 | Kim et al. |
| 6,768,860 B2 | 7/2004 | Liberty |
| 6,804,447 B2 | 10/2004 | Smith et al. |
| 6,809,258 B1 | 10/2004 | Dang et al. |
| 6,810,193 B1 | 10/2004 | Muller |
| 6,845,208 B2 | 1/2005 | Thibault et al. |
| 6,865,331 B2 | 3/2005 | Mertesdorf |
| 6,925,241 B2 | 8/2005 | Bohle et al. |
| 6,934,457 B2 | 8/2005 | Vincent et al. |
| 6,945,620 B2 | 9/2005 | Lam et al. |
| 6,968,111 B2 | 11/2005 | Trebesch et al. |
| 7,006,748 B2 | 2/2006 | Dagley et al. |
| 7,068,907 B2 | 6/2006 | Schray |
| 7,070,459 B2 | 7/2006 | Denovich et al. |
| 7,079,744 B2 | 7/2006 | Douglas et al. |
| 7,116,777 B2 | 10/2006 | Knudsen et al. |
| 7,120,348 B2 | 10/2006 | Trebesch et al. |
| 7,171,099 B2 | 1/2007 | Barnes et al. |
| 7,203,997 B2 * | 4/2007 | Morgan .................... E05D 3/18 16/369 |
| 7,302,153 B2 | 11/2007 | Thom |
| 7,302,154 B2 | 11/2007 | Trebesch et al. |
| 7,308,184 B2 | 12/2007 | Barnes et al. |
| 7,367,823 B2 | 5/2008 | Rapp et al. |
| 7,373,071 B2 | 5/2008 | Douglas et al. |

(56) References Cited

U.S. PATENT DOCUMENTS

| | | |
|---|---|---|
| 7,406,240 B2 | 7/2008 | Murano |
| 7,409,137 B1 | 8/2008 | Barnes |
| 7,460,757 B2 | 12/2008 | Hoehne et al. |
| 7,462,779 B2 | 12/2008 | Caveney et al. |
| 7,463,811 B2 | 12/2008 | Trebesch et al. |
| 7,496,268 B2 | 2/2009 | Escoto et al. |
| 7,499,623 B2 | 3/2009 | Barnes et al. |
| 7,570,860 B2 | 8/2009 | Smrha et al. |
| 7,570,861 B2 | 8/2009 | Smrha et al. |
| 7,664,361 B2 | 2/2010 | Trebesch et al. |
| 7,689,089 B2 | 3/2010 | Wagner et al. |
| 7,706,656 B2 | 4/2010 | Zimmel |
| 7,715,681 B2 | 5/2010 | Krampotich et al. |
| 7,747,125 B1 | 6/2010 | Lee et al. |
| RE41,460 E | 7/2010 | Wheeler |
| 7,751,674 B2 | 7/2010 | Hill |
| 7,764,859 B2 | 7/2010 | Krampotich et al. |
| 7,856,166 B2 | 12/2010 | Biribuze et al. |
| 7,869,683 B2 | 1/2011 | Barnes et al. |
| 7,873,252 B2 | 1/2011 | Smrha et al. |
| 7,873,253 B2 | 1/2011 | Smrha et al. |
| 7,876,993 B2 | 1/2011 | Krampotich et al. |
| 7,889,961 B2 | 2/2011 | Cote et al. |
| 7,945,135 B2 | 5/2011 | Cooke et al. |
| 7,945,138 B2 | 5/2011 | Hill et al. |
| 8,027,558 B2 | 9/2011 | Barnes et al. |
| 8,059,932 B2 | 11/2011 | Hill et al. |
| 8,078,030 B2 | 12/2011 | Trebesch et al. |
| 8,195,022 B2 | 6/2012 | Coburn et al. |
| 8,229,265 B2 | 7/2012 | Solheid et al. |
| 8,285,104 B2 | 10/2012 | Davis et al. |
| 8,340,490 B2 | 12/2012 | Smrha et al. |
| 8,346,044 B2 | 1/2013 | Smrha et al. |
| 8,363,998 B2 | 1/2013 | Newman et al. |
| 8,374,477 B2 | 2/2013 | Hill |
| 8,433,171 B2 | 4/2013 | Cooke et al. |
| 8,452,148 B2 | 5/2013 | Cooke et al. |
| 8,452,149 B2 | 5/2013 | Krampotich et al. |
| 8,559,785 B2 | 10/2013 | Barlowe et al. |
| 8,600,208 B2 | 12/2013 | Badar et al. |
| 8,639,081 B2 | 1/2014 | Barnes et al. |
| 8,655,136 B2 | 2/2014 | Trebesch et al. |
| 8,690,593 B2 | 4/2014 | Anderson et al. |
| 8,705,926 B2 | 4/2014 | Giraud et al. |
| 8,867,884 B2 | 10/2014 | Smrha et al. |
| 8,886,335 B2 | 11/2014 | Pianca et al. |
| 8,923,013 B2 | 12/2014 | Anderson et al. |
| 8,934,252 B2 | 1/2015 | Anderson et al. |
| 8,934,253 B2 | 1/2015 | Anderson et al. |
| 8,953,921 B2 | 2/2015 | Smrha et al. |
| 9,020,319 B2 | 4/2015 | Anderson et al. |
| 9,020,320 B2 | 4/2015 | Cooke et al. |
| 9,066,453 B2 | 6/2015 | Wagner et al. |
| 9,075,217 B2 | 7/2015 | Giraud et al. |
| 9,097,871 B2 | 8/2015 | Smrha et al. |
| 9,366,064 B1 * | 6/2016 | Chen ............... E05F 1/12 |
| 9,488,788 B2 | 11/2016 | Murray et al. |
| 9,535,226 B2 | 1/2017 | Simmons |
| 9,673,598 B2 * | 6/2017 | DeBartolo, Jr. ....... H02G 3/185 |
| 9,677,308 B1 * | 6/2017 | Chen ............... E05D 3/06 |
| 9,816,304 B2 * | 11/2017 | Wells ............... E05D 3/12 |
| 9,841,789 B2 * | 12/2017 | Lin ............... G06F 1/1615 |
| 10,082,636 B2 | 9/2018 | Solheid et al. |
| 10,146,259 B1 * | 12/2018 | Wu ............... G06F 1/1681 |
| 10,278,298 B2 | 4/2019 | De Vis et al. |
| 10,364,598 B2 * | 7/2019 | Tazbaz ............. E05D 11/1064 |
| 10,416,727 B2 * | 9/2019 | Lin ............... G06F 1/1681 |
| 10,465,427 B2 * | 11/2019 | Chen ............... E05D 3/18 |
| 10,539,757 B2 * | 1/2020 | Ruiz ............... H04Q 1/025 |
| 11,134,579 B2 * | 9/2021 | Huang ............... G06F 1/1616 |
| 11,136,806 B2 * | 10/2021 | Kuramochi ............. E05F 3/221 |
| 11,281,261 B2 * | 3/2022 | Cheng ............... E05D 11/0054 |
| 2001/0001270 A1 | 5/2001 | Williams Vigliaturo |
| 2002/0181922 A1 | 12/2002 | Xin et al. |
| 2003/0007767 A1 | 1/2003 | Douglas et al. |
| 2003/0128951 A1 | 7/2003 | Lecomte et al. |
| 2003/0165315 A1 | 9/2003 | Trebesch et al. |
| 2003/0174996 A1 | 9/2003 | Henschel et al. |
| 2003/0190035 A1 | 10/2003 | Knudsen et al. |
| 2004/0007348 A1 | 1/2004 | Stoller |
| 2004/0011750 A1 | 1/2004 | Kim et al. |
| 2004/0013390 A1 | 1/2004 | Kim et al. |
| 2004/0033027 A1 | 2/2004 | Pang et al. |
| 2004/0136676 A1 | 7/2004 | Mertesdorf |
| 2004/0175090 A1 | 9/2004 | Vastmans et al. |
| 2004/0258384 A1 | 12/2004 | Trebesch et al. |
| 2005/0025444 A1 | 2/2005 | Barnes et al. |
| 2005/0058421 A1 | 3/2005 | Dagley et al. |
| 2005/0078929 A1 | 4/2005 | Iwanek |
| 2005/0100301 A1 | 5/2005 | Solheid et al. |
| 2005/0111809 A1 | 5/2005 | Giraud et al. |
| 2005/0116595 A1 | 6/2005 | Milligan |
| 2005/0123261 A1 | 6/2005 | Bellekens et al. |
| 2005/0199354 A1 | 9/2005 | Marandon et al. |
| 2005/0201008 A1 * | 9/2005 | Lee ................ G11B 33/02 360/96.51 |
| 2006/0093302 A1 | 5/2006 | Solheid et al. |
| 2006/0168759 A1 | 8/2006 | Laursen |
| 2006/0269206 A1 | 11/2006 | Zimmel |
| 2006/0275008 A1 | 12/2006 | Xin |
| 2007/0003204 A1 | 1/2007 | Makrides-Saravanos et al. |
| 2007/0031099 A1 | 2/2007 | Herzog et al. |
| 2007/0036503 A1 | 2/2007 | Solheid et al. |
| 2007/0047893 A1 | 3/2007 | Kramer et al. |
| 2007/0189692 A1 | 8/2007 | Zimmel et al. |
| 2007/0201806 A1 | 8/2007 | Douglas et al. |
| 2008/0079341 A1 | 4/2008 | Anderson et al. |
| 2008/0080828 A1 | 4/2008 | Leon et al. |
| 2008/0175550 A1 | 7/2008 | Coburn et al. |
| 2008/0180004 A1 | 7/2008 | Martich et al. |
| 2009/0067800 A1 | 3/2009 | Vazquez et al. |
| 2009/0067802 A1 | 3/2009 | Hoehne et al. |
| 2009/0097813 A1 | 4/2009 | Hill |
| 2009/0129033 A1 | 5/2009 | Smrha et al. |
| 2009/0214171 A1 | 8/2009 | Coburn et al. |
| 2009/0226142 A1 | 9/2009 | Barnes et al. |
| 2009/0245743 A1 | 10/2009 | Cote et al. |
| 2009/0274431 A1 | 11/2009 | Krampotich et al. |
| 2010/0054683 A1 | 3/2010 | Cooke et al. |
| 2010/0142910 A1 | 6/2010 | Hill et al. |
| 2010/0158465 A1 | 6/2010 | Smrha |
| 2010/0183276 A1 | 7/2010 | Smith |
| 2010/0189403 A1 | 7/2010 | Keith et al. |
| 2010/0209064 A1 | 8/2010 | Ruiz |
| 2010/0266253 A1 | 10/2010 | Krampotich et al. |
| 2010/0296790 A1 | 11/2010 | Cooke et al. |
| 2010/0310225 A1 | 12/2010 | Anderson et al. |
| 2010/0316346 A1 | 12/2010 | Krampotich et al. |
| 2010/0322578 A1 | 12/2010 | Cooke et al. |
| 2010/0322580 A1 | 12/2010 | Beamon et al. |
| 2010/0322582 A1 | 12/2010 | Cooke et al. |
| 2011/0018809 A1 | 1/2011 | Nochi et al. |
| 2011/0019964 A1 | 1/2011 | Nhep et al. |
| 2011/0026894 A1 | 2/2011 | Rudenick et al. |
| 2011/0154615 A1 * | 6/2011 | Shen .................. H04M 1/0216 16/331 |
| 2011/0188809 A1 | 8/2011 | LeBlanc et al. |
| 2011/0211799 A1 | 9/2011 | Conner et al. |
| 2011/0217016 A1 | 9/2011 | Mullsteff |
| 2011/0232035 A1 | 9/2011 | Huang et al. |
| 2011/0267742 A1 | 11/2011 | Togami et al. |
| 2011/0267794 A1 | 11/2011 | Anderson et al. |
| 2011/0268404 A1 | 11/2011 | Cote et al. |
| 2011/0268405 A1 | 11/2011 | Cote et al. |
| 2011/0268407 A1 | 11/2011 | Cowen et al. |
| 2011/0268408 A1 | 11/2011 | Giraud et al. |
| 2011/0268410 A1 | 11/2011 | Giraud et al. |
| 2011/0268412 A1 | 11/2011 | Giraud et al. |
| 2011/0286712 A1 | 11/2011 | Puetz et al. |
| 2011/0317974 A1 | 12/2011 | Krampotich et al. |
| 2012/0008900 A1 | 1/2012 | Schneider |
| 2012/0051708 A1 | 3/2012 | Badar et al. |
| 2012/0057838 A1 | 3/2012 | Hill et al. |
| 2012/0237173 A1 | 9/2012 | Alston et al. |

(56) References Cited

U.S. PATENT DOCUMENTS

| | | | |
|---|---|---|---|
| 2012/0267991 A1 | 10/2012 | Adducci et al. | |
| 2012/0288249 A1 | 11/2012 | Ruiz | |
| 2012/0321269 A1 | 12/2012 | Kramer et al. | |
| 2013/0039623 A1 | 2/2013 | Zhang | |
| 2013/0089292 A1 | 4/2013 | Ott et al. | |
| 2013/0089298 A1 | 4/2013 | Holmberg et al. | |
| 2013/0108231 A1 | 5/2013 | Mertesdorf | |
| 2013/0148936 A1 | 6/2013 | Hill | |
| 2013/0183018 A1 | 7/2013 | Holmberg | |
| 2013/0322832 A1 | 12/2013 | Wang et al. | |
| 2014/0003782 A1 | 1/2014 | Blackwell, Jr. et al. | |
| 2014/0086545 A1 | 3/2014 | Solheid et al. | |
| 2014/0133819 A1 | 5/2014 | Trebesch et al. | |
| 2014/0168878 A1* | 6/2014 | Jheng | G06F 1/1681 16/221 |
| 2014/0208542 A1 | 7/2014 | White | |
| 2014/0219614 A1 | 8/2014 | Marcouiller et al. | |
| 2014/0219615 A1 | 8/2014 | Petersen et al. | |
| 2014/0248028 A1 | 9/2014 | Campbell et al. | |
| 2014/0265794 A1 | 9/2014 | Schroeder et al. | |
| 2014/0334790 A1 | 11/2014 | Zhang | |
| 2015/0177780 A1 | 6/2015 | Anderson et al. | |
| 2015/0195945 A1 | 7/2015 | Anderson et al. | |
| 2015/0219869 A1 | 8/2015 | Anderson et al. | |
| 2015/0245530 A1 | 8/2015 | Anderson et al. | |
| 2015/0286021 A1 | 10/2015 | Smrha et al. | |
| 2015/0331214 A1 | 11/2015 | Smrha et al. | |
| 2015/0331215 A1 | 11/2015 | Smrha et al. | |
| 2015/0331216 A1 | 11/2015 | Smrha et al. | |
| 2016/0077297 A1 | 3/2016 | Wells et al. | |
| 2016/0231525 A1 | 8/2016 | Murray et al. | |
| 2016/0370025 A1 | 12/2016 | De Zorzi et al. | |
| 2017/0147035 A1* | 5/2017 | Han | G06F 1/1681 |
| 2017/0208703 A1* | 7/2017 | Lin | H05K 7/16 |
| 2018/0206352 A1* | 7/2018 | Lin | E05D 3/18 |
| 2018/0252013 A1* | 9/2018 | Phillips | E05D 5/00 |
| 2019/0124421 A1 | 4/2019 | Ruiz | |
| 2019/0257125 A1* | 8/2019 | Bloh | H02B 1/38 |
| 2019/0260331 A1* | 8/2019 | Liu | E05D 11/06 |
| 2020/0325713 A1* | 10/2020 | Tsorng | E05D 3/12 |
| 2021/0025207 A1* | 1/2021 | Nuss | E05D 3/12 |
| 2021/0081004 A1* | 3/2021 | Huang | E05D 3/12 |
| 2022/0083106 A1* | 3/2022 | Su | F16C 11/04 |
| 2022/0112751 A1* | 4/2022 | Tipper | E05D 11/1007 |

FOREIGN PATENT DOCUMENTS

| | | |
|---|---|---|
| CN | 102203653 A | 9/2011 |
| CN | 102460261 A | 5/2012 |
| CN | 202421594 U | 9/2012 |
| DE | 27 35 106 A1 | 2/1979 |
| DE | 29 18 309 A1 | 11/1980 |
| DE | 33 08 682 A1 | 9/1984 |
| DE | 38 36 273 A1 | 4/1990 |
| DE | 44 13 136 C1 | 5/1995 |
| DE | 295 04 191 U1 | 3/1996 |
| EP | 0 146 478 A2 | 6/1985 |
| EP | 0 149 250 A2 | 7/1985 |
| EP | 0356942 A2 | 3/1990 |
| EP | 0 406 151 A2 | 1/1991 |
| EP | 0 464 570 A1 | 1/1992 |
| EP | 0 479 226 A1 | 4/1992 |
| EP | 0 196 102 B1 | 3/1993 |
| EP | 0 538 164 A1 | 4/1993 |
| EP | 0 606 152 A2 | 7/1994 |
| EP | 0 801 317 A2 | 10/1997 |
| EP | 0 563 995 B1 | 10/1999 |
| FR | 2 531 576 A1 | 2/1984 |
| FR | 2 587 127 A1 | 3/1987 |
| FR | 2 678 076 A1 | 12/1992 |
| GB | 2 504 281 A | 1/2014 |
| JP | 59-74523 A | 4/1984 |
| JP | 60-169811 A | 9/1985 |
| JP | 61-55607 A | 3/1986 |
| JP | 61-90104 A | 5/1986 |
| JP | 2002-270286 A | 9/2002 |
| JP | 2009-097157 A | 5/2009 |
| KR | 20-0337929 A | 1/2004 |
| KR | 2008-0033420 A | 4/2008 |
| WO | 91/10927 A1 | 7/1991 |
| WO | 95/07480 A1 | 3/1995 |
| WO | 96/10203 A1 | 4/1996 |
| WO | 99/00619 A1 | 1/1999 |
| WO | 03/005095 A2 | 1/2003 |
| WO | 2010/083369 A1 | 7/2010 |
| WO | 2010/135523 A1 | 11/2010 |
| WO | 2011/094327 A1 | 8/2011 |
| WO | 2011/100613 A1 | 8/2011 |
| WO | 2013/052854 A2 | 4/2013 |
| WO | 2013/106820 A1 | 7/2013 |
| WO | 2013/177413 A1 | 11/2013 |
| WO | 2014/052441 A1 | 4/2014 |
| WO | 2015/040211 A1 | 3/2015 |
| WO | 2016/012295 A1 | 1/2016 |
| WO | 2016/040866 A1 | 3/2016 |
| WO | 2017/184501 A1 | 10/2017 |

OTHER PUBLICATIONS

"ITU Fiber Handbook" with English translation, 14 pages, Mar. 1992.
"Precision Mechanical" with English Translation, 5 pages.
Northern Telecom Bulletin #91-004, Issue #2, May 1991.
AT&T Product Bulletin 2987D-DLH-7/89, "High Density Interconnect System (HDIC)," Issue 2 (Copyright 1989).
Preface to the book "Structure, Installation, Connection and Protection of Communication Optical Fiber Cable", in Chinese with English translation, 14 pages (Mar. 1992).
Complaint relating to Civil Action No. 5:11-cv-02509-JS, *ADC Telecommunications, Inc.* v. *OPterna Am, Inc.*, filed Apr. 11, 2011 (14 pages).
Complaint relating to Civil Action No. 1:11cv-735 (GBL-ISS), *ADC Telecommunications, Inc,* v. *Opterna Am, Inc.*, filed Jul. 12, 2011 (5 pages).
Plaintiff's Notice of Dismissal relating to Civil Action No. 5:11-cv-02509-JS, *ADC Telecommunications, Inc.* v. *Opterna AM, Inc.*, filed Jul. 12, 2011 (1 page).
Stipulation and Order of Dismissal relating to Civil Action No. 1:11-cv-735-GBL-IDD, *ADC Telecommunications, Inc.* v. *Opterna Am, Inc.*, filed Feb. 21, 2012 (2 pages).

* cited by examiner

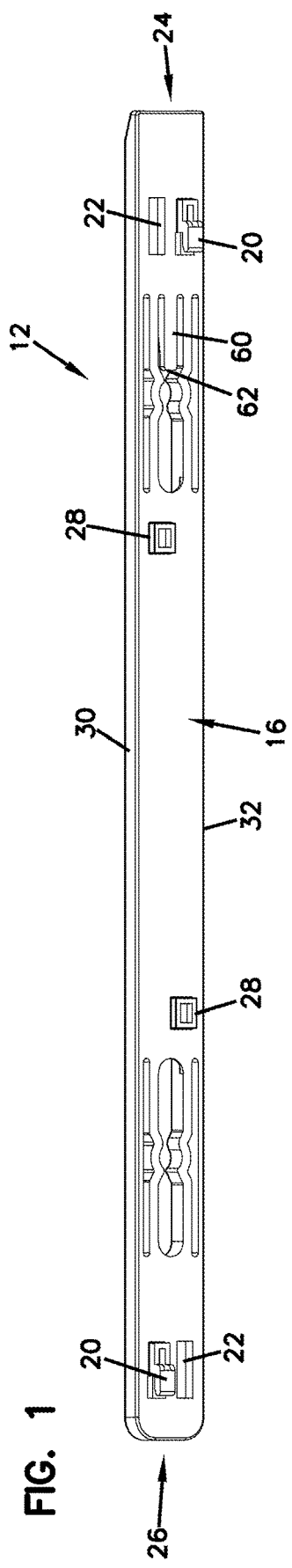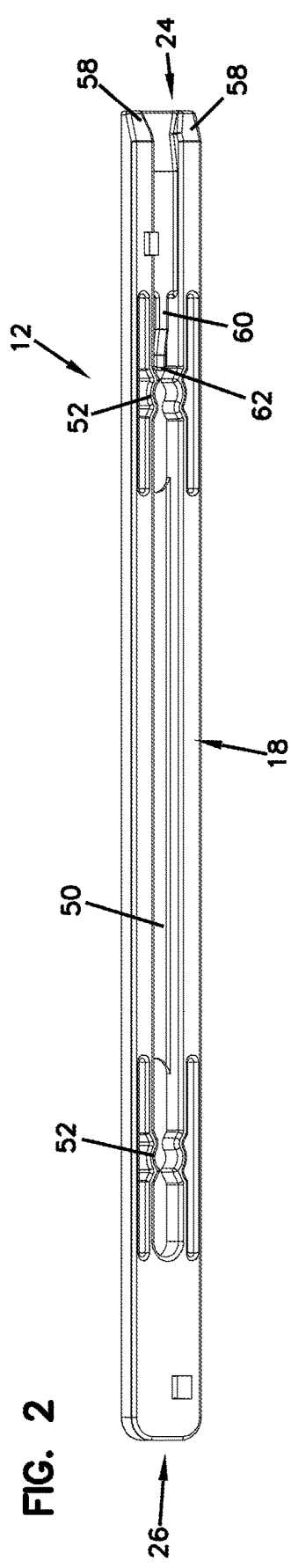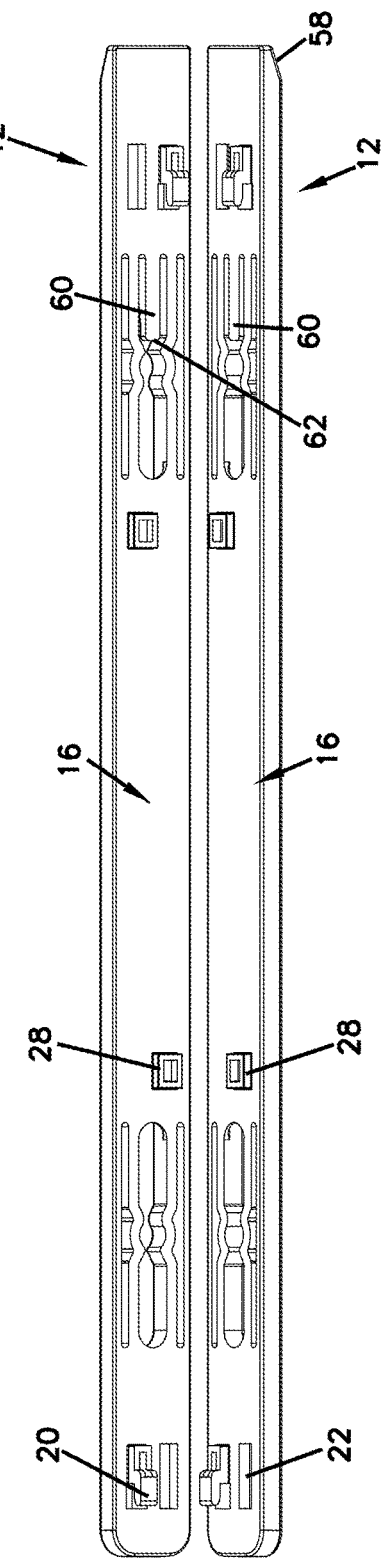

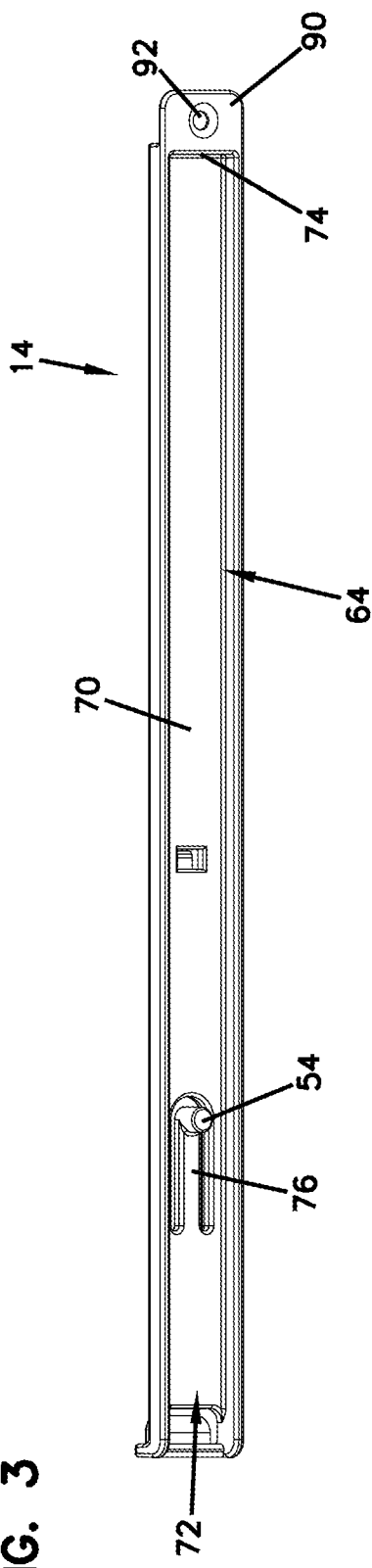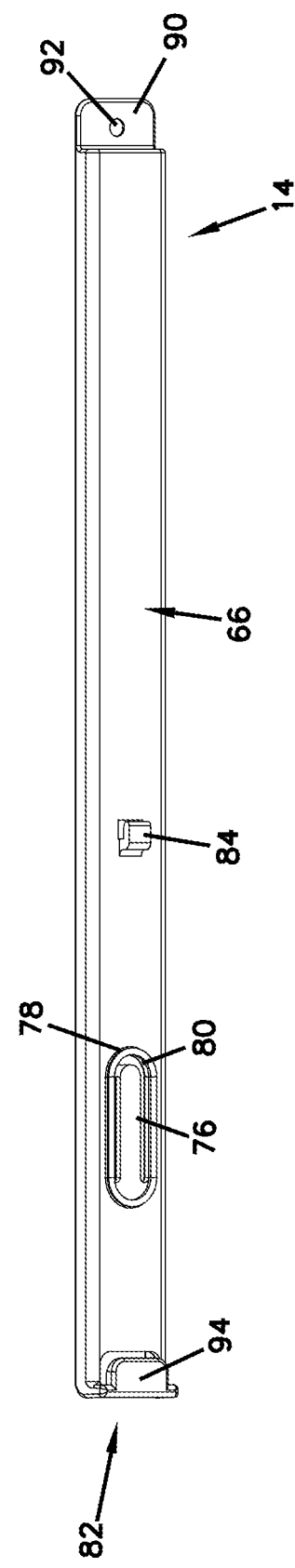

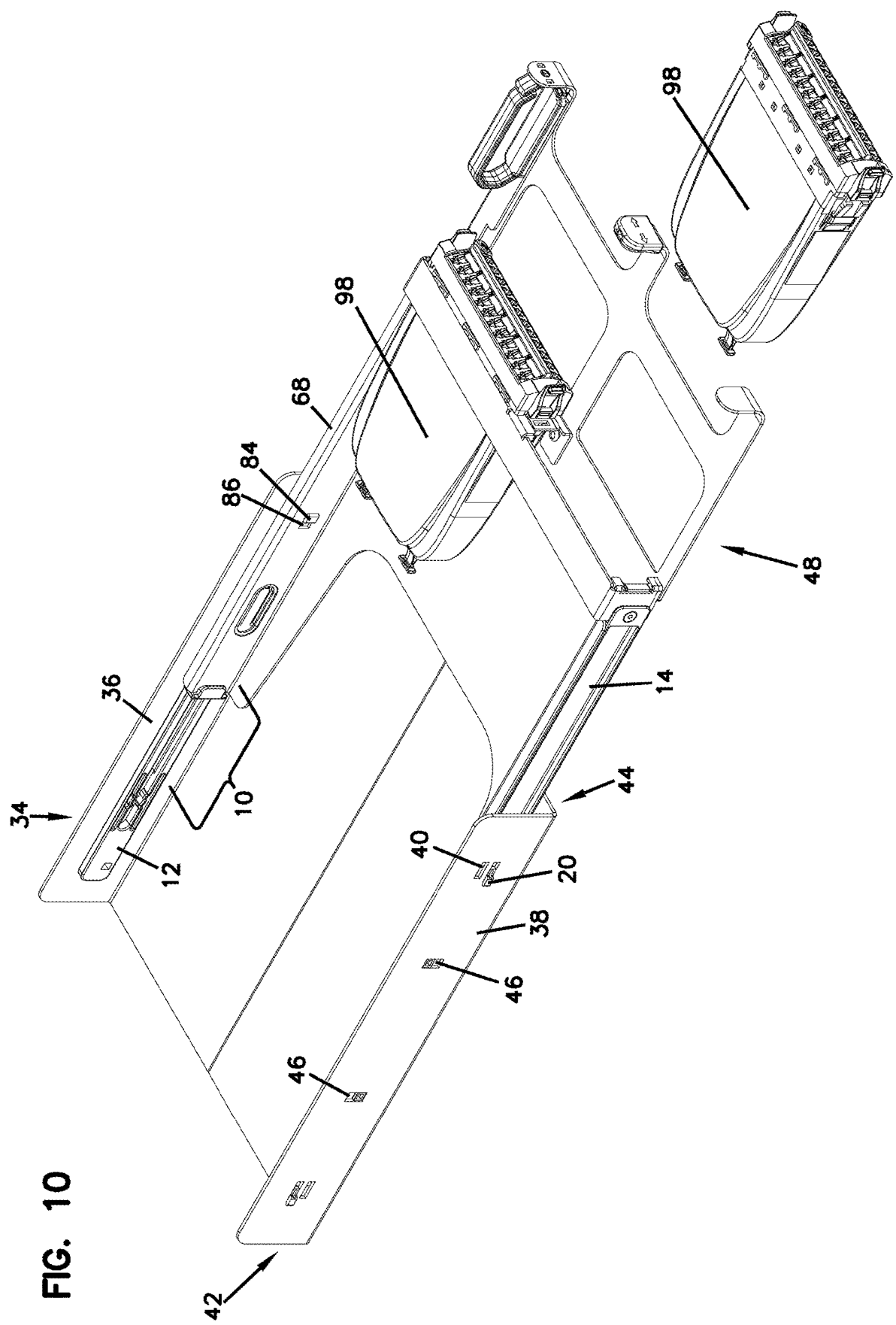

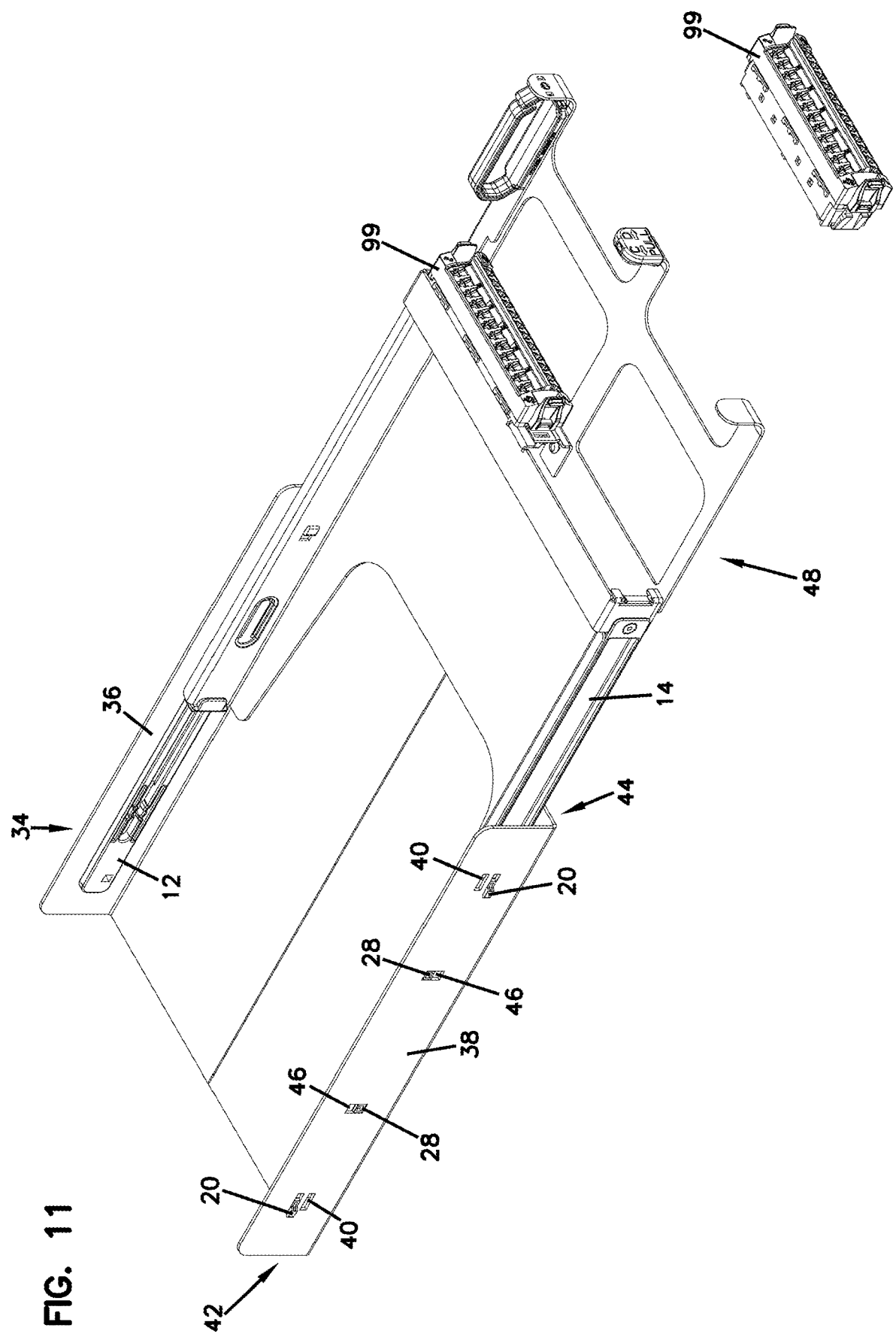

DOOR ASSEMBLY FOR A TELECOMMUNICATIONS CHASSIS WITH A COMBINATION HINGE STRUCTURE

CROSS-REFERENCE TO RELATED APPLICATION

This application is a National Stage of PCT/US2017/027915, filed on Apr. 17, 2017, which claims the benefit of U.S. Patent Application Ser. No. 62/324,685, filed on Apr. 19, 2016, the disclosures of which are incorporated herein by reference in their entireties. To the extent appropriate, a claim of priority is made to each of the above disclosed applications.

TECHNICAL FIELD

The present disclosure relates generally to telecommunications equipment. More specifically, the present disclosure relates to equipment designed for high density applications such as telecommunications chassis.

BACKGROUND

In the telecommunications industry, the demand for added capacity is growing rapidly. This demand is being met in part by the increasing use and density of telecommunications equipment, specifically, fiber optic transmission equipment. Even though fiber optic equipment permits higher levels of transmission in the same or smaller footprint than traditional copper transmission equipment, the demand requires even higher levels of fiber density. This has led to the development of high-density fiber handling equipment.

Because of the large number of optical fibers passing into and out of fiber optic equipment such as high density fiber distribution frames, such frames normally incorporate a variety of structures to organize and manage the fibers. Such frames also include structures for facilitating access to the densely packed terminations. Drawer-based systems including slidable equipment-carrying trays are known.

Further developments in such systems are desired.

SUMMARY

The present disclosure relates to a telecommunications device in the form of a telecommunications frame or chassis. The telecommunications chassis is a drawer-based system with sliding trays for providing access to the equipment housed within the trays. According to one example embodiment, the telecommunications equipment housed within the trays may be fiber optic devices.

According to one aspect of the disclosure, the telecommunications chassis described herein includes a door assembly that includes a hinge assembly utilizing a combination hinge structure that allows both pivotal motion for the door and further pivotal motion for the hinge structure.

According to one example embodiment, the hinge assembly for pivotally coupling the door to a telecommunications chassis comprises a hinge structure configured to attach the door to the telecommunications chassis, the hinge structure defining a door pivot point and a hinge pivot point that is spaced from the door pivot point, wherein a door coupled by the hinge structure to the telecommunications chassis can pivot with respect to the hinge structure independent of a pivoting motion of the hinge structure with respect to the telecommunications chassis, wherein the hinge structure further defines at least a portion of a pivot limiting structure spaced from the hinge pivot point, the portion of the pivot limiting structure defined by the hinge structure being configured to interact with the telecommunications chassis in limiting the pivoting motion of the hinge structure.

According to another aspect, the disclosure relates to a telecommunications system comprising a telecommunications chassis and a door pivotally attached to the telecommunications chassis via a hinge assembly. The hinge assembly further comprises a hinge structure extending between the telecommunications chassis and the door, the hinge structure defining a door pivot point and a hinge pivot point that is spaced from the door pivot point, wherein a door coupled by the hinge structure to the telecommunications chassis can pivot with respect to the hinge structure independent of a pivoting motion of the hinge structure with respect to the telecommunications chassis, wherein the hinge structure further defines at least a portion of a pivot limiting structure spaced from the hinge pivot point, the portion of the pivot limiting structure defined by the hinge structure being configured to interact with the telecommunications chassis in limiting the pivoting motion of the hinge structure.

According to yet another aspect, the disclosure relates to a telecommunications system comprising a telecommunications chassis and a door pivotally attached to the telecommunications chassis via a hinge assembly. The hinge assembly further comprises a single hinge structure extending between the telecommunications chassis and the door, the hinge structure defining a door pivot point and a hinge pivot point that is spaced from the door pivot point, wherein a door coupled by the hinge structure to the telecommunications chassis can pivot with respect to the hinge structure independent of a pivoting motion of the hinge structure with respect to the telecommunications chassis, wherein the hinge structure is configured such that the door is entirely positionable below a horizontal plane defined by a bottom side of the chassis when the door is at a fully open position.

According to yet another aspect, the disclosure relates to a door assembly for mounting to a telecommunications chassis, the door assembly comprising a door defining a front face extending between a right side and a left side, the door further including a door pivot pin protruding from each of the right side and the left side, the door pivot pins positioned forward of the front face of the door and a hinge assembly for each of the right side and the left side of the door, wherein at least a portion of the hinge assembly is configured to be mounted to the door. The hinge assembly further comprises a single hinge structure defining a door pivot point including an opening configured to receive the door pivot pin and a hinge pivot point that is spaced from the door pivot point such that, when the door is coupled by the hinge structure to the telecommunications chassis, the door can pivot with respect to the hinge structure independent of a pivoting motion of the hinge structure with respect to the telecommunications chassis.

A variety of additional inventive aspects will be set forth in the description that follows. The inventive aspects can relate to individual features and combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

FIG. 1 is a perspective view showing the outer side of a tray rail of an inventive slide assembly of the present disclosure;

FIG. 2 is a perspective view showing the inner side of the tray rail of FIG. 1;

FIG. 3 is a perspective view showing the outer side of a tray guide of the inventive slide assembly of the present disclosure, the tray guide configured to mate with the tray rail of FIGS. 1-2 in forming the inventive slide assembly of the present disclosure;

FIG. 4 is a perspective view showing the inner side of the tray guide of FIG. 3;

FIG. 9 illustrates the two nestable tray rails of FIG. 8 in isolation removed from the chassis;

FIG. 10 illustrates the tray of FIG. 8 in an extended position, wherein one of the fiber optic cassettes is also shown exploded off the tray;

FIG. 11 illustrates the tray of FIG. 10 populated with telecommunications equipment in the form of fiber optic adapter blocks instead of fiber optic cassettes;

DETAILED DESCRIPTION

Figure 5:
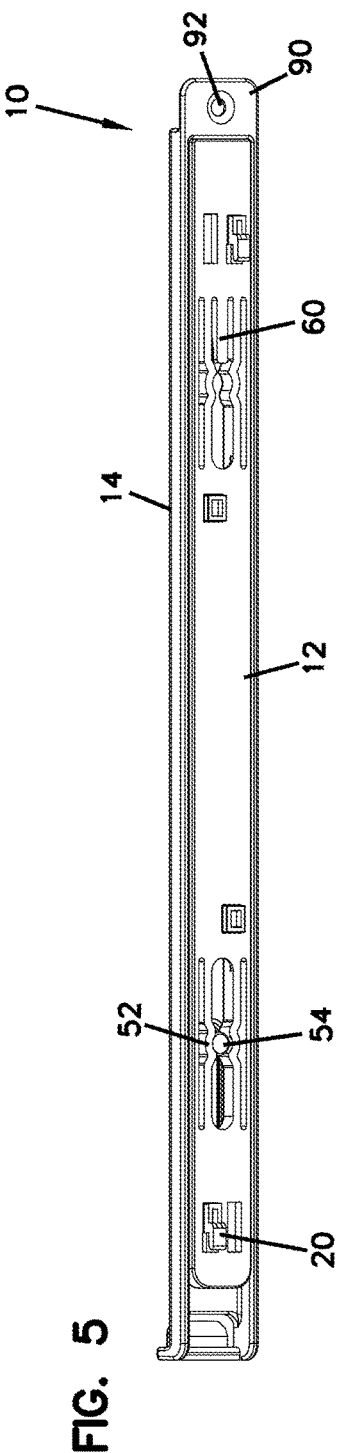
FIG. 5 illustrates the tray rail of FIGS. 1-2 nested within the tray guide of FIGS. 3-4, the slide assembly shown in a stored position.

Reference will now be made in detail to examples of inventive aspects of the present disclosure which are illustrated in the accompanying drawings. Wherever possible, the same reference numbers will be used throughout the drawings to refer to the same or like parts.

Referring now to FIGS. 1-6, a slide assembly 10 having features that are examples of inventive aspects in accordance with the present disclosure is illustrated. The slide assembly 10 is configured for use in a telecommunications fixture such as a chassis or frame for forming a drawer-based system with sliding trays for providing access to the equipment housed within the trays.

Examples of telecommunications chassis and trays that can utilize the slide assembly are illustrated, for example, in FIGS. 7, 8, 10, 11-18, and 24-26 of the present application, further details of which will be discussed hereinafter.

Still referring to FIGS. 1-6, the slide assembly 10 is comprised of a tray rail 12 and a tray guide 14 that slidably cooperates with the tray rail 12. The tray rail portion 12 of the slide assembly 10 is configured to be mounted to the telecommunications fixture (e.g., a chassis/frame) and the tray guide portion 14 is configured to be mounted to the equipment trays. The slidable cooperation of the tray rail 12 and the tray guide 14 provide movement to the trays between stored and extended positions as will be discussed.

It should be noted that, unless otherwise specified, for ease of description and illustration, only one slide assembly 10 that can be used on one side of a chassis or a tray will be described herein with the understanding that all of the features discussed are applicable to the opposing side enabling slidable movement of the entire tray.

FIG. 1 illustrates a perspective view showing the outer side 16 of the tray rail 12, and FIG. 2 illustrates a perspective view showing the inner side 18 of the tray rail 12. As illustrated, for example, in FIGS. 10-11, the outer side 16 of each tray rail 12 is configured for mounting to an interior face of a chassis wall.

As shown in FIG. 1, on the outer side 16, each tray rail 12 includes a latch 20 and a latch pocket 22 adjacent a front end 24 and a latch 20 and a latch pocket 22 adjacent the rear end 26 of the rail 12. The tray rail 12 also defines a locking tab 28 toward the front end 24 and a locking tab 28 toward the rear end 26 thereof. The latches 20, the latch pockets 22, and the locking tabs 28 are all configured for mounting the tray rail 12 to a chassis wall, wherein these structures cooperate with intermating structures provided on the chassis wall for mounting the tray rail 12.

As shown, the latches 20 and the latch pockets 22 on the front and rear ends 24, 26 of the tray rail 12 are positioned in opposite orientations. The locking tabs 28 are also provided in an opposite diagonal orientation, wherein the front locking tab 28 is closer to an upper edge 30 of the rail 12 and the rear locking tab 28 is closer to a lower edge 32 of the tray rail 12. This opposing configuration of the latches 20, the latch pockets 22, and the locking tabs 28 allows two similar tray rails 12 to be mounted in a juxtaposed relationship with a chassis wall (e.g., a center chassis wall) captured therein-between. As shown in FIG. 9, when the outer sides 16 of two similar tray rails 12 are brought together, the latches 20 at the front end 24 can nest within aligned respective latch pockets 22, and the latches 20 at the rear end 26 can nest within aligned respective latch pockets 22. As noted above, a similar feature is provided for the locking tabs 28. When the outer sides 16 of two similar tray rails 12 are brought together, the locking tabs 28 of the tray rails 12 align in a nested overlapping or vertically stacked configuration without abutting each other.

An example of a telecommunications fixture in the form of a chassis 34 is shown in FIGS. 10-11 with the tray rail 12 mounted to each of the right and left walls 36, 38 of the chassis 34. As illustrated by the left wall 38 of the chassis 34, each wall 36, 38 defines a pair of parallel openings 40 adjacent a rear end 42 and a pair of parallel openings 40 adjacent a front end 44. One of the openings 40 of each pair is configured to receive a latch 20 and the other of the openings 40 of the pair is configured to align with a latch pocket 22 provided at the front and rear ends 24, 26 of the tray rail 12 as shown in FIGS. 10-11.

Still referring to FIGS. 10-11, the latches 20 are slidably inserted into their respective openings 40, and, as depicted, a rearward movement of the tray rails 12 brings both the front and rear locking tabs 28 into alignment with tab openings 46 provided on the chassis walls 36, 38 to lock the tray rails 12 into place.

As discussed above, the tab openings 46 provided on the chassis walls 36, 38 are sized large enough to be able to accommodate two locking tabs 28 each in a vertically stacked arrangement to be able to allow a wall 36, 38 of the chassis 34 to be used as a center wall that separates two horizontal trays 48.

Figure 8:
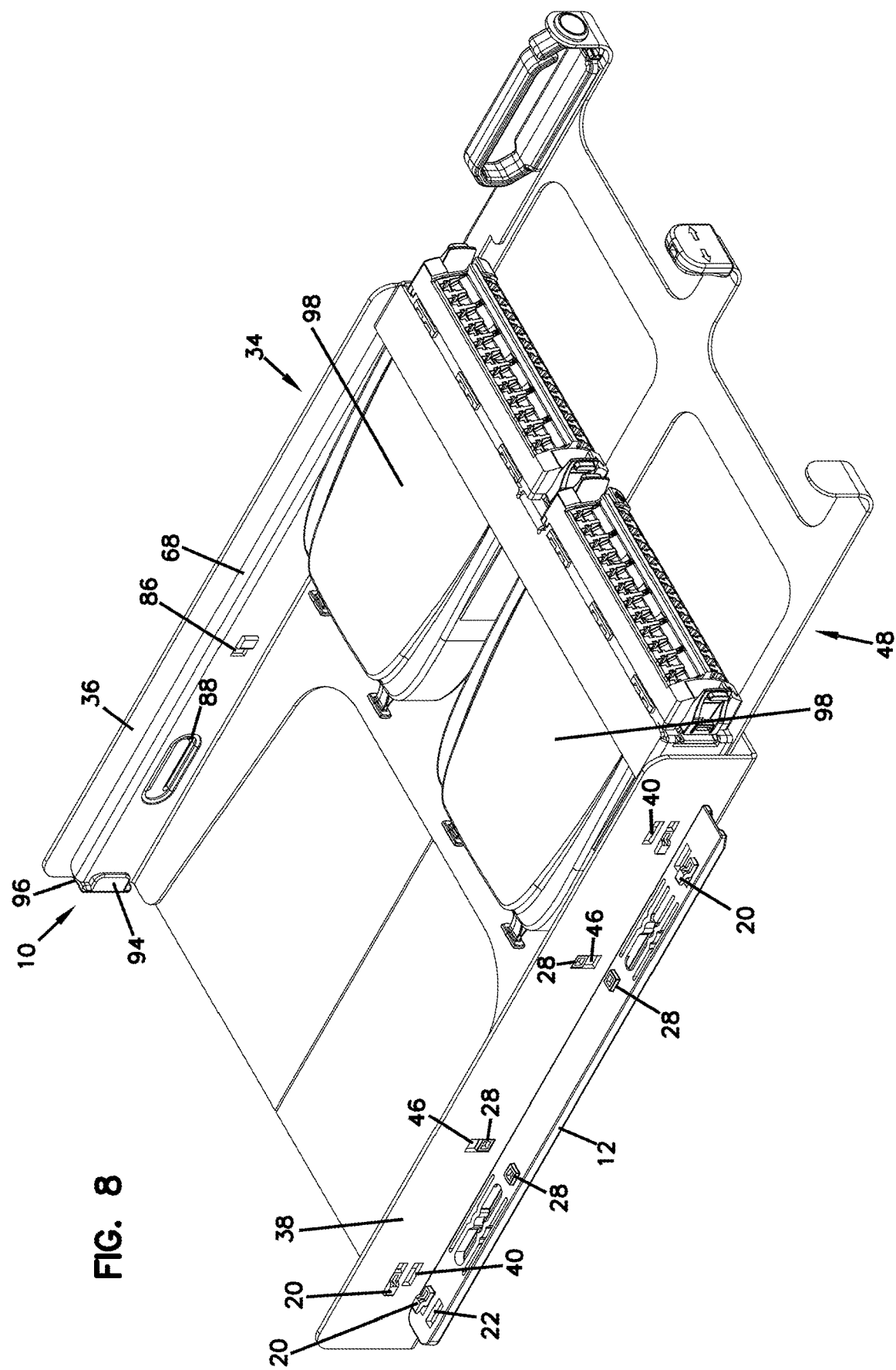
FIG. 8 illustrates the tray of FIG. 7 populated with telecommunications equipment in the form of fiber optic cassettes and mounted to a telecommunications chassis, the left wall of the chassis also being used to illustrate how two similar tray rails of the present disclosure can cooperate and nest together when they share and are mounted on both sides of a chassis wall such as a center wall separating two side-by-side slidable trays.

As illustrated in FIGS. 8 and 9, the configuration of the tray rails 12 (and the intermating structures of the chassis walls 36, 38) allow the use of the same rails 12 to be used on both sides of a chassis wall 36, 38, allowing a chassis wall 36, 38 to be used as a shared center wall that can separate two side-by-side slidable trays 48. The tab openings 46 are sized to accommodate two locking tabs 28 in a vertically stacked arrangement. And, the front and rear latches 20 of one of the tray rails 12 can nest within the front and rear latch pockets 22 of a juxtaposed tray rail 12 through the openings 40 provided on the chassis wall 36, 38, allowing a single chassis wall to be used as a shared center wall.

Referring now to the inner side 18 of each tray rail 12, as shown in FIG. 2, on the inner side 18, a sliding cavity 50 is provided that defines a detent 52 adjacent the rear end 26 of the tray rail 12 and a detent 52 adjacent the front end 24 of the tray rail 12. As will be discussed in further detail below, the front and rear detents 52 are configured to cooperate with a pin 54 provided on the tray guide 14 of the slide assembly 10 for fixing (at least temporarily) the trays 48 at stored and extended positions relative to the chassis 34 as noted above.

Still referring to FIG. 2, the sliding cavity 50 defines an open end 56 at the front end 24 of the tray rail 12 for initially receiving the pin 54 of the tray guide 14 when slidably placing the tray 48 within the chassis 34. The front end 24 of the tray rail 12 also defines a tapered portion 58 to act as a lead-in end to facilitate the relative insertion of the tray rail 12 into the tray guide 14 as will be discussed in further detail below.

Still referring to FIG. 2, as the pin 54 of the tray guide 14 is initially inserted into the sliding cavity 50, the pin 54 elastically deflects and clears a stop structure 60, a portion of which is located within the cavity 50. The stop structure 60 defines a tapered configuration to facilitate the insertion of the pin 54 into the cavity 50. After the pin 54 has cleared the stop structure 60 and is within the cavity 50, an end 62 of the stop structure 60 that is at least partially positioned within the cavity 50 is configured to abut and provide a positive stop for the pin 54 during extension of the tray 48. In FIG. 8, the tray 48 is shown in the stored position, with the pin 54 of the tray guide 14 latched to the rear detent 52 of the tray rail 12. In FIGS. 10-11, the tray 48 is shown in the extended position, with the pin 54 of the tray guide 14 latched to the front detent 52 of the tray rail 12. From the fixed (either stored or extended) positions, a force that overcomes the biasing force applied by the flexible detents 52 to the pin 54 has to be overcome in order to move the tray 48.

Referring now to the tray guide 14, the details thereof are illustrated in FIGS. 3-4. FIG. 3 is a perspective view showing the outer side 64 of a tray guide 14, and FIG. 4 is a perspective view showing the inner side 66 of the tray guide 14.

The outer side 64 of the tray guide 14 is configured to cooperate with the tray rail 12 of the slide assembly 10. The inner side 66 of the tray guide 14 is configured for latching to a wall 68 of one of the sliding equipment trays 48.

The outer side 64, as shown in FIG. 3, defines a sliding cavity 70 for slidably receiving the tray rail 12. The sliding cavity 70 defines an open end 72 for initially receiving the tapered lead-in front end 24 of the tray rail 12 and also a closed end 74 defining a stop for limiting further sliding movement of the tray rail 12 within the sliding cavity 70 of the tray guide 14.

Figure 6:
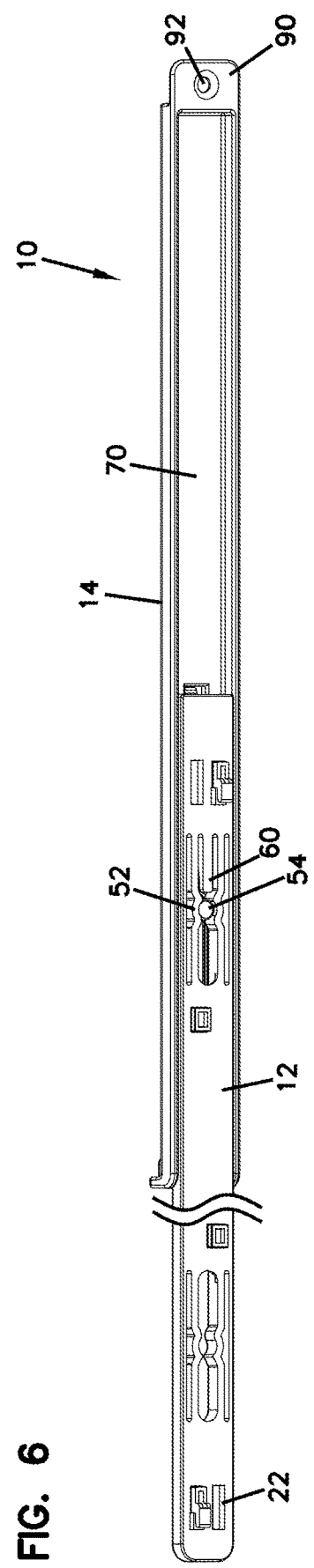
FIG. 6 illustrates the slide assembly of FIG. 5 in an extended position, wherein the tray guide has been moved and interlocked with respect to the tray rail in a forward position.

As shown in FIG. 3, the pin 54 of the tray guide 14 is positioned within and has at least a portion protruding into the sliding cavity 70 and, as discussed above, rides within the sliding cavity 50 of the tray rail 12 when the rail 12 and the guide 14 are in a sliding relationship. In FIG. 5, the tray rail 12 is shown within the sliding cavity 70 of the tray guide 14, wherein the slide assembly 10 is shown in a stored position with the pin 54 of the tray guide 14 captured within the rear detent 52 of the tray rail 12. In FIG. 6, the slide assembly 10 is shown in an extended position with the pin 54 of the tray guide 14 captured within the front detent 52 of the tray rail 12.

The stored position of the slide assembly 10 of FIG. 5 is also illustrated in FIG. 8 in the context of a chassis/tray system. And, the extended position of the slide assembly 10 of FIG. 6 is also illustrated in the context of a chassis/tray system in FIGS. 10-11.

Now, referring back to FIG. 3, the pin 54 is connected to the tray guide via a flexible cantilever arm 76. In order to completely remove the tray guide 14 from the tray rail 12 and completely remove an equipment tray 48 from the chassis 34, the flexible arm 76 has to be pushed or pried in a direction from the outer side 64 of the tray guide 14 toward the inner side 66 thereof to clear the stop structure 60 provided on the tray rail 12.

Referring now to FIG. 4, the inner side 66 of the tray guide 14 is illustrated. The inner side 66 forms the tray-mount side of the tray guide 14, whereas the outer side 64 cooperates with the tray rail 12 in providing the slidable motion for the tray 48. The inner side 66 defines an alignment rim 78 that surrounds an aperture 80 for accessing the cantilever arm 76. The alignment rim 78 is generally positioned toward a rear end 82 of the tray guide 14. The inner side 66 also defines a latch 84 that is positioned generally toward the center of the tray guide 14. As shown in FIGS. 7, 8, 10, and 11, the latch 84 is slidably inserted into an opening 86 defined on a tray wall 68 until the alignment rim 78 aligns with and snaps into a larger opening 88 provided on the tray wall 68 in latching the tray guide 14 to a tray 48.

As shown in FIGS. 3, 4, 7, 8, 10, and 11, the tray guide 14 includes a flange 90 defining a mounting hole 92 for receiving a fastener for further securing the tray guide 14 to a tray wall 68. The rear end 82 of the tray guide 14 also defines a wraparound latch 94 that covers a rear edge 96 of the tray wall 68 and acts as an edge protector for any fibers leading toward the back of the chassis 34 during slidable movement of the tray 48.

As noted previously, the slide assembly 10 may be used to provide a drawer-based system allowing equipment carrying trays 48 to be accessed by sliding the trays 48 relative to a telecommunications fixture such as a chassis or frame. An example of such a chassis/tray system that has been referred to above in describing the features of the inventive slide assembly is illustrated in FIGS. 7, 8, 10, and 11. As noted above, although need not be, such systems may be fiber optic systems and may house equipment forming fiber termination points or connection locations that need to be accessed by the pull-out trays 48.

Figure 7:
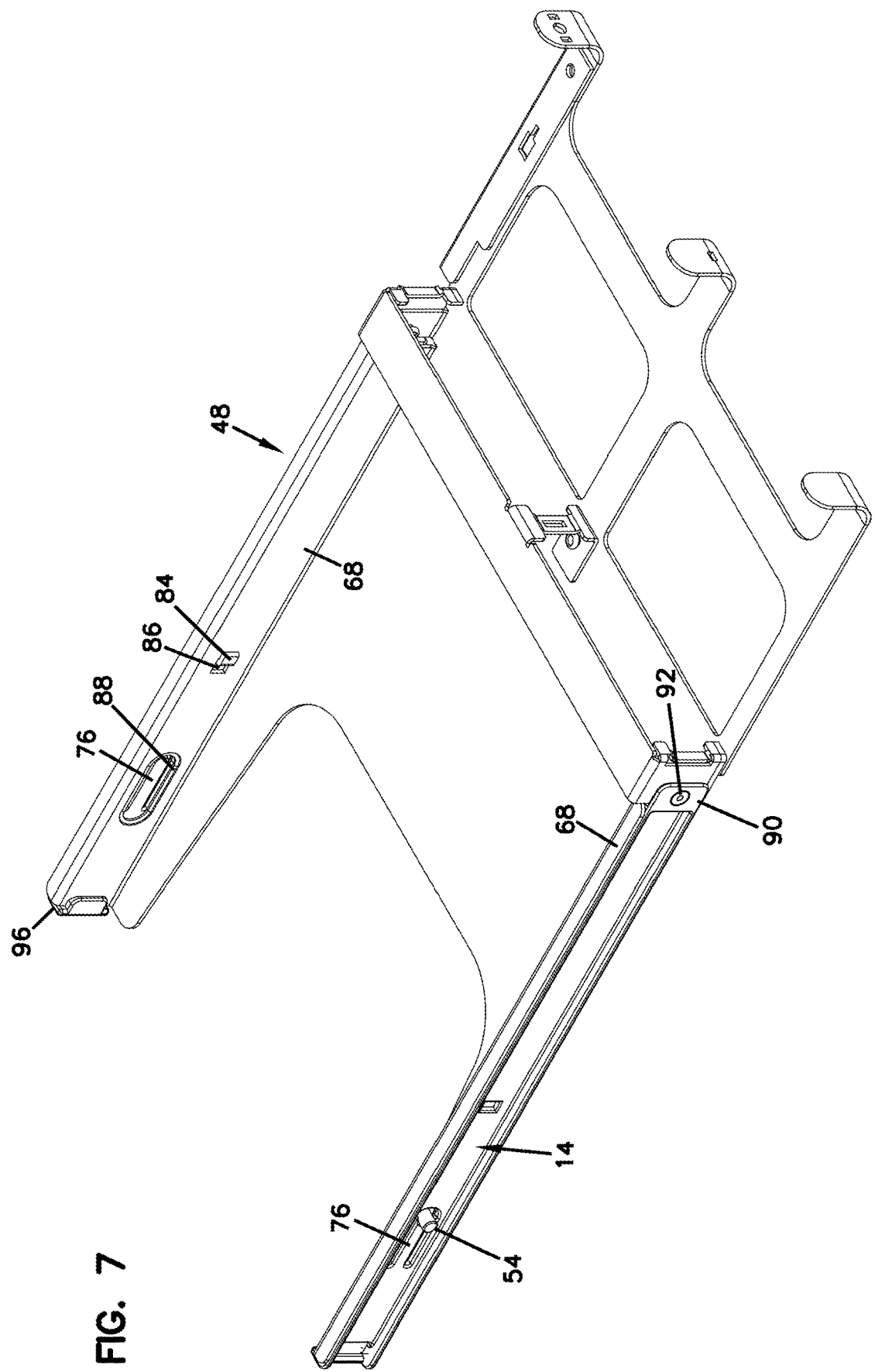
FIG. 7 illustrates an example telecommunications tray configured for mounting to a telecommunications fixture in the form of a chassis or frame using the slide assembly of FIGS. 1-6, the tray illustrated with the tray guides of the slide assembly mounted thereon.

In the embodiment of the system illustrated in FIGS. 8 and 10, the tray 48, which is shown empty in FIG. 7, is shown as populated with telecommunications equipment in the form of fiber optic cassettes 98 and mounted to a telecommunications fixture in the form of a chassis 34. In FIG. 8, the left wall 38 of the particular chassis 34 is being used to illustrate the possible nesting of two similar tray rails 12 if the left wall 38 were to be used as a center wall separating two side-by-side slidable trays 48. In the embodiment of the system illustrated in FIG. 11, the tray 48 is shown as populated with telecommunications equipment in the form of fiber optic adapter blocks 99 instead of fiber optic cassettes 98.

The illustrated telecommunications systems including the fiber optic systems including the pull-out trays 48 and chassis 34 shown in FIGS. 7, 8, 10, and 11 are simply example embodiments that can be used with the inventive slide assembly 10 described herein and are used to illustrate the inventive features thereof, with the understanding that the inventive features of the slide assembly 10 may be utilized on other specific or other types of drawer-based systems.

Referring now to FIGS. 12-23, a door assembly 100 for use on a telecommunications fixture such as a chassis similar to chassis 34 of FIGS. 8, 10, and 11 is illustrated. The door assembly 100 includes a door 102 that is configured to be mounted to a front end of a chassis and a hinge assembly 104 used in mounting the door 102. The hinge assembly 104 allows the door 102 to be pivotally moved between a closed position and a fully open position. The door 102 includes a spring-loaded latch 106 for keeping the door 102 in the closed position. An example embodiment of the latch 106 is illustrated in FIGS. 12-18, with the understanding that other various latch designs may be utilized.

It should also be noted that, unless otherwise specified, for ease of description and illustration, the door assembly 100 and the hinge assembly 104 will be described with respect to only one side thereof and with respect to only one side of a chassis with the understanding that all of the features discussed are applicable to the opposing side enabling opening and closing of the door 102.

Figure 12:
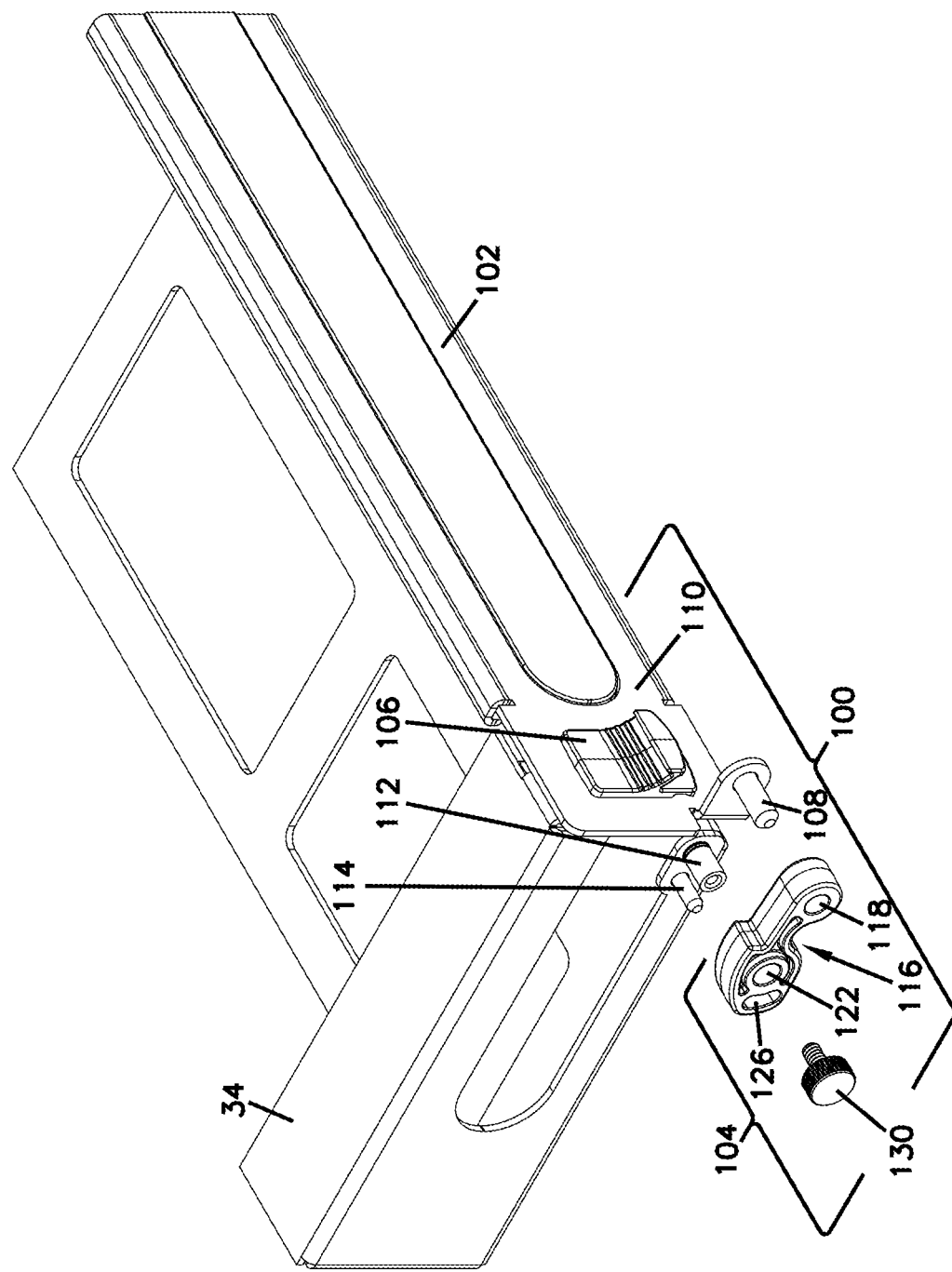
FIG. 12 is a partially exploded view of a door assembly that includes an inventive hinge assembly according to the present disclosure, the hinge assembly configured for mounting the door to a telecommunications fixture similar to the chassis shown in FIGS. 8, 10, and 11.
Figure 13:
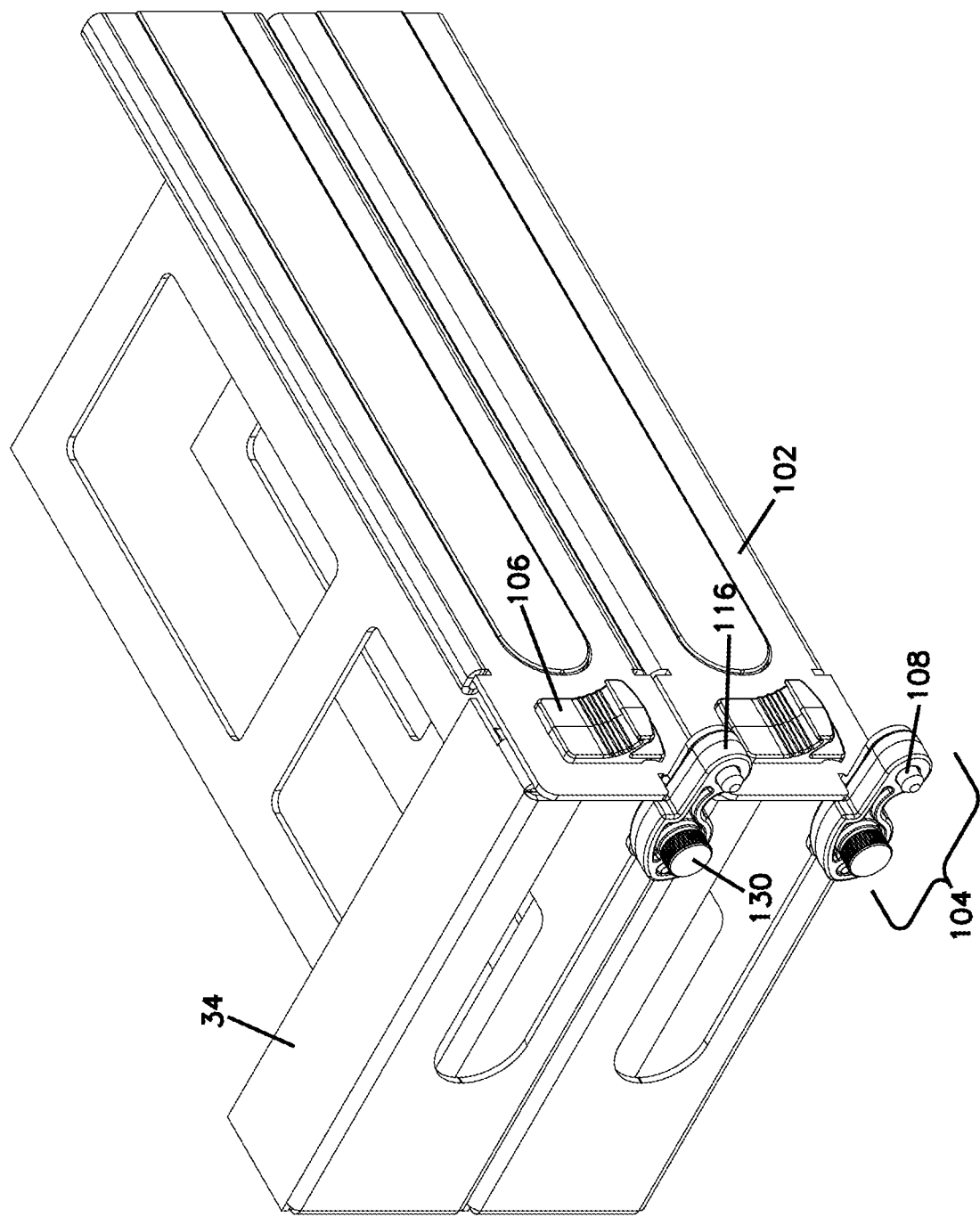
FIG. 13 illustrates two of the door assemblies shown in FIG. 12 in a fully assembled configuration, the door assemblies used on a chassis similar to that shown in FIG. 12 but including two levels for supporting slidable trays.

Referring now specifically to FIG. 12, the door 102 of the door assembly 100 defines a door pivot pin 108. As shown, the door pivot pin 108 is spaced apart from a front face 110 of the door 102, the reason for which will be described in further detail below.

Still referring to FIG. 12, each of the right and left walls of the chassis 34 (only the left wall illustrated for simplicity) includes a hinge pivot pin 112 and a hinge stop pin 114.

A hinge structure 116 of the hinge assembly 104 provides the pivotal connection between the door 102 and the chassis 34. The hinge structure 116 defines a first pin receiver 118 adjacent a front end 120 for receiving the door pivot pin 108. The hinge structure 116 defines a second pin receiver 122 toward a center portion 124 of the hinge structure 116, spaced apart from the first pin receiver 118, for receiving the hinge pivot pin 112 of the chassis 34. The hinge structure 116 further defines a hinge limit slot 126 adjacent a rear end 128 thereof, spaced apart from the second pin receiver 122. The hinge limit slot 126 is configured to receive the hinge stop pin 114 of the chassis 34. The hinge structure 116 is shown in isolation in FIGS. 19-23.

After the hinge structure 116 has been mounted so as to provide a connection between the door 102 and the chassis 34, a fastener 130 is removably mounted to the hinge pivot pin 112. The fastener 130 allows pivotal motion of the hinge structure 116 while keeping the hinge structure 116 coupled to the chassis 34. The door 102, via the door pivot pins 108, are captured against the chassis 34 by the hinge structures 116 at the right and left walls of the chassis 34.

The door assembly 100 and the hinge assembly 104 are configured such that the hinge structure 116 provides two pivot points for the door. The interaction of the door pivot pin 108 and the first pin receiver 118 allows a first pivoting motion for the door 102, wherein the door 102 is pivoted with respect to the hinge structure 116. The interaction of the hinge pivot pin 112 and the second pin receiver 122 allows a second pivoting motion for the door 102, wherein the hinge structure 116, itself, and the door 102 are both pivoted with respect to the chassis 34.

Now referring to FIGS. 12-16, regarding the first pivoting motion for the door 102, the position of the door pivot pin 108 being spaced forward of the front face 110 of the door 102 allows the door 102 to be spaced forward enough to clear a door 102 therebelow when in a fully open position. This is shown in the side view in FIG. 16. When the door 102 is open 180 degrees, due to the forward position of the door pivot pin 108, the door 102 is spaced far enough forward to clear and be in front of the door 102 therebelow.

Still referring to FIGS. 12-16, regarding the second pivoting motion for the door 102, given that the hinge structure 116 is also able to pivot with respect to the chassis 34, provides further movement to the pivot point established by the door pivot pin 108 of the door 102 and the first pin receiver 118 of the hinge structure 116. Such further travel allows the door 102 to be positioned below a horizontal plane $P_H$ defined by a bottom wall 132 of that level of the chassis 34. As such, the door 102, when fully opened, does not interfere with the slidable extension of the tray 48 at its respective level on the chassis 34. And, as noted above, when fully opened, is positioned far enough forward so as to clear the door assembly 100 (including the latch 106 of the door 102) and the hinge assembly 104 therebelow.

As shown in FIGS. 12-16, the hinge structure 116 defines a lower arch 134 at a bottom portion 136 thereof for allowing the hinge structure 116 to clear the door 102 below when the door 102 is in the fully open position. The accommodation by the arch 134 of a door 102 therebelow is shown in detail in FIG. 16.

Figure 14:
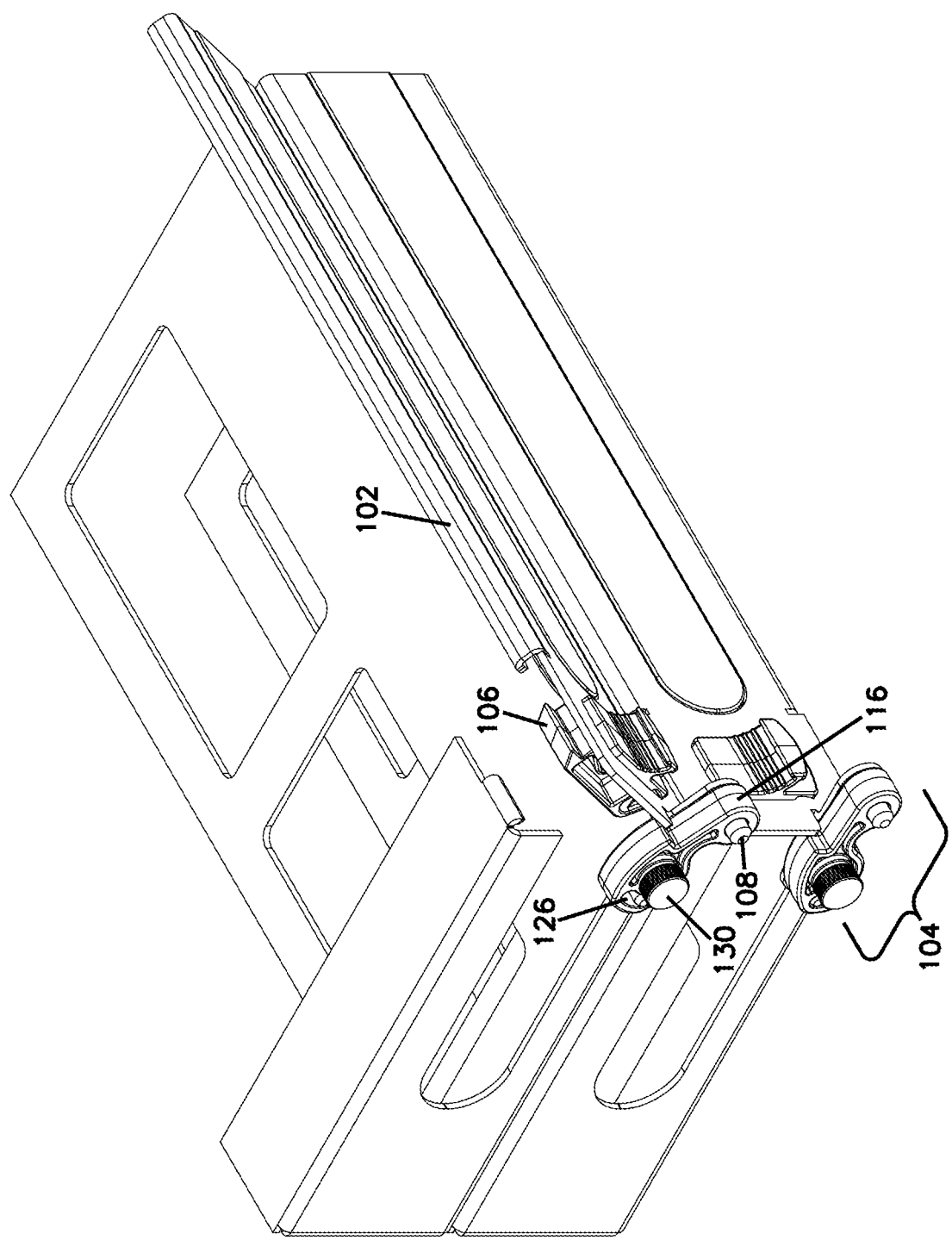
FIG. 14 illustrates the upper door of FIG. 13 in a partially open position.
Figure 15:
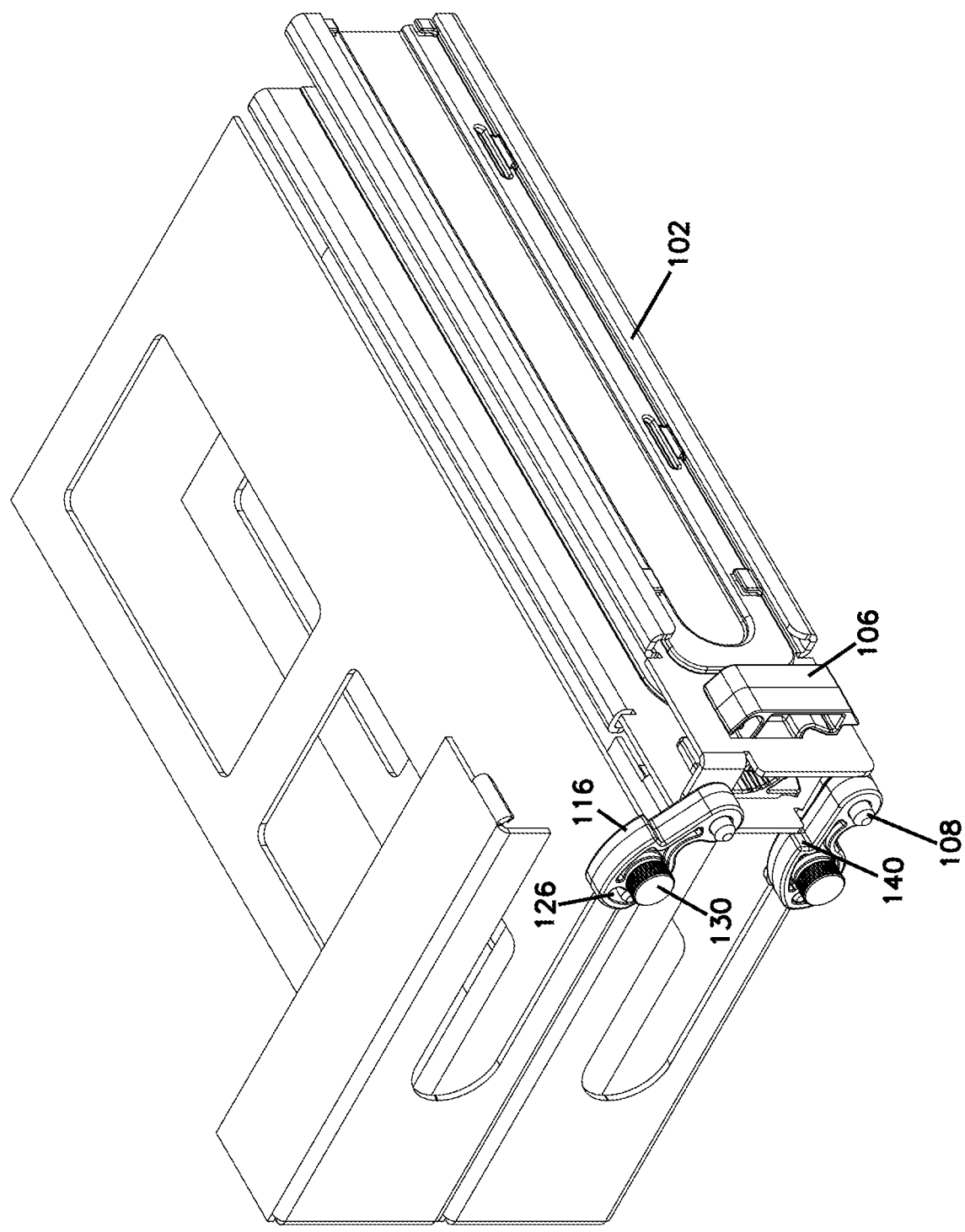
FIG. 15 illustrates the upper door of FIG. 14 in a fully open position.
Figure 16:
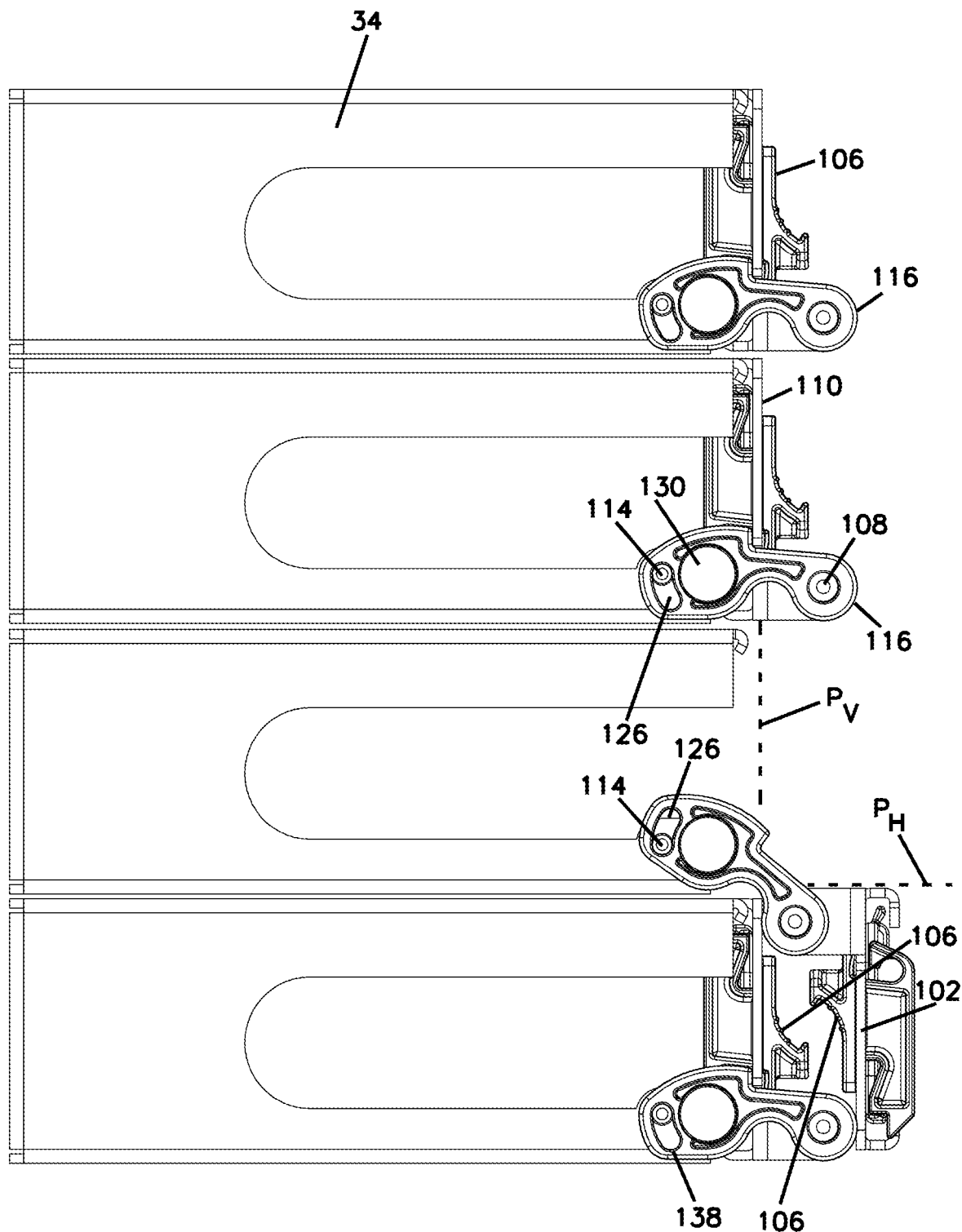
FIG. 16 illustrates the side view of a chassis similar to that shown in FIGS. 13-15 but including four levels for supporting slidable trays, one of the four doors of the chassis shown in a fully open position.

As shown in FIGS. 12-16, the interaction of the hinge stop pin 114 and the hinge limit slot 126 provides positive stops for the movement of the hinge structure 116 during its pivoting motion so as to limit the travel of the hinge structure 116. The size and shape of the hinge limit slot 126 is configured to provide positive stops at the desired closed and open positions for the door 102, as illustrated in FIG. 16. According to certain embodiments, during the opening of the door 102, if the hinge structure 116 is pivoted first, the hinge limit slot 126 provides a stop for the hinge stop pin 114 when the door 102 has been opened about 35 degrees from a vertical plane $P_V$. This position is shown in FIG. 14. Once the hinge stop pin 114 has contacted a lower end 138 of the hinge limit slot 126, the door 102 can now be pivoted with respect to the hinge structure 116 to allow the door 102 to open past the 35-degree angle to the fully opened position, which is shown in FIGS. 15-16.

The hinge structure 116 also defines a hinge wall 140 that is configured to be contacted by the door 102 during the pivotal closing motion of the door 102. In moving the door 102 to the closed position, after the door 102 goes through its initial first pivoting motion, the door 102 contacts the hinge wall 140 to start moving the hinge structure 116 for the second pivoting motion. The interaction between the door 102 and the hinge wall 140 allows a technician to bring both the door 102 and the hinge structure 116 to their original positions with a single smooth motion.

As noted above, once the door 102 is brought to its closed position, the door 102 is latched to the chassis 34 via the spring-loaded latch 106. When the door 102 is in the closed position, the door 102 rests against the hinge wall 140.

Still referring to FIGS. 12-16, it should be noted that a rear portion 142 of the hinge structure 116 defines a smooth arched profile at an upper end 144 thereof. The smooth profile of the upper arch 144 provides edge protection to any fibers that may be in the area during tray extension.

Figure 17:
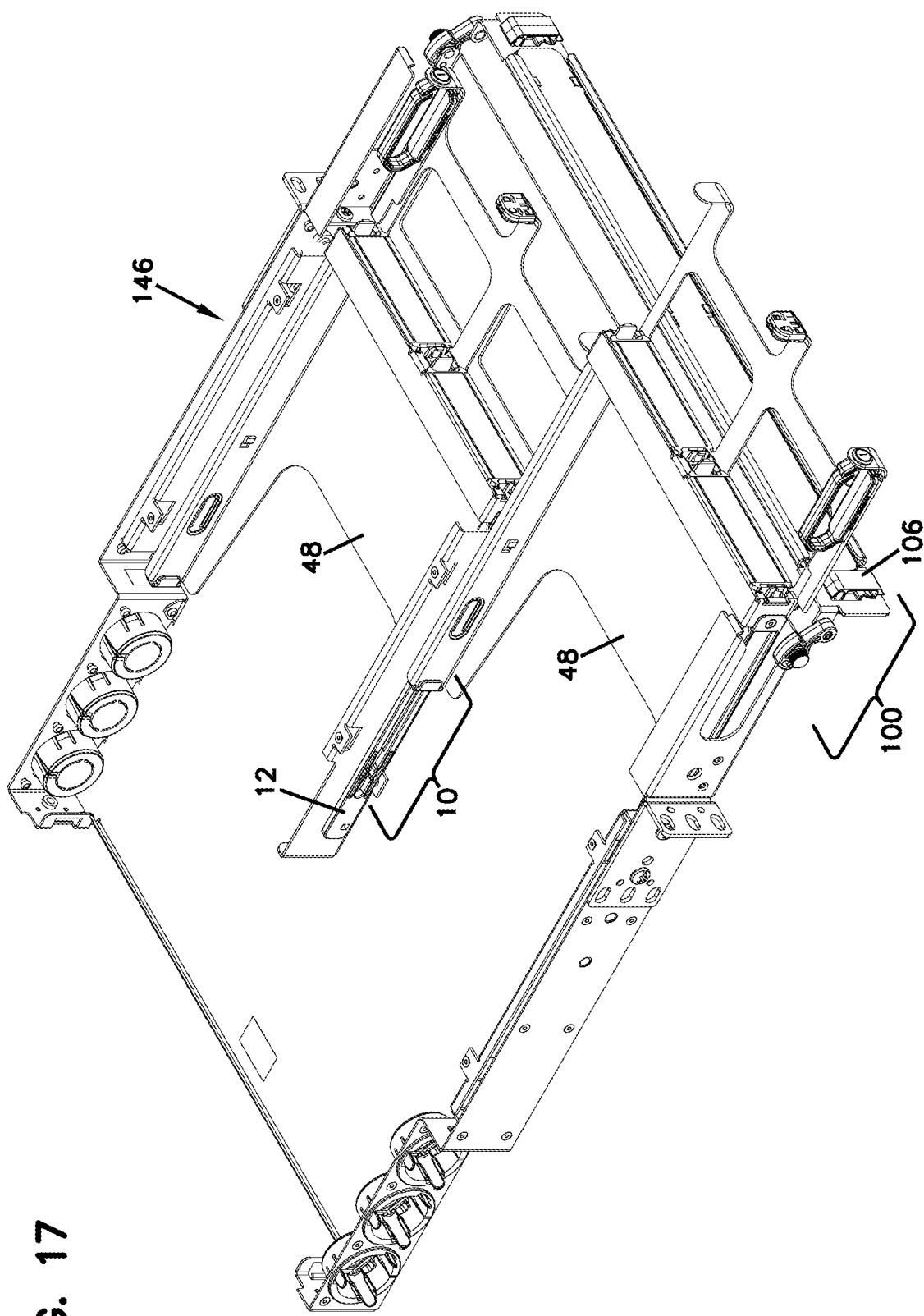
FIG. 17 illustrates a perspective view of another example of a telecommunications fixture in the form of a chassis similar to the chassis shown in FIGS. 8, 10, and 11-16, the chassis shown with one of the trays thereof in a stored position and one in an extended position, with the door of the chassis in a fully open position allowing extension of the sliding tray.
Figure 18:
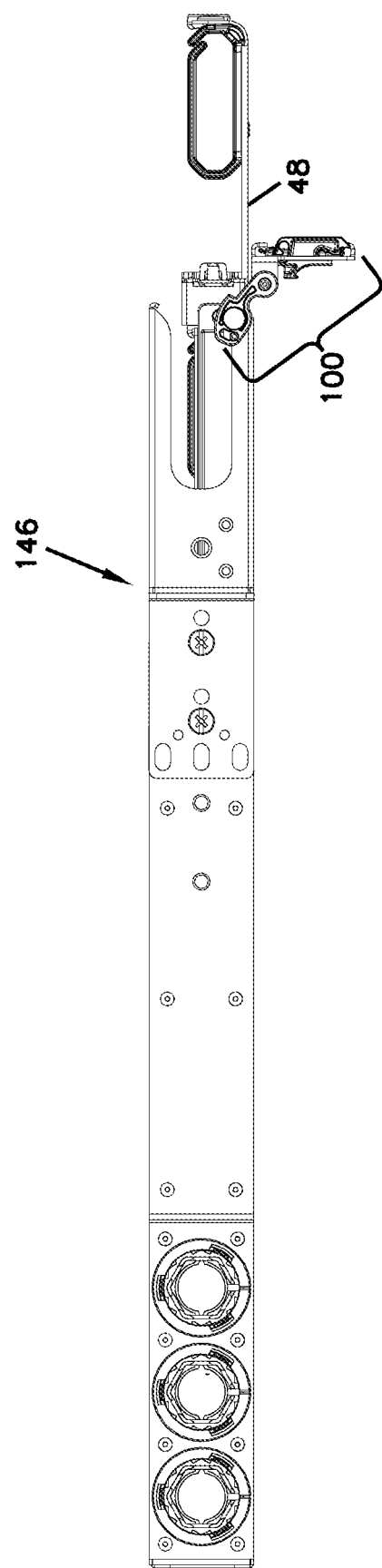
FIG. 18 is a side view of the chassis of FIG. 17.
Figure 19:
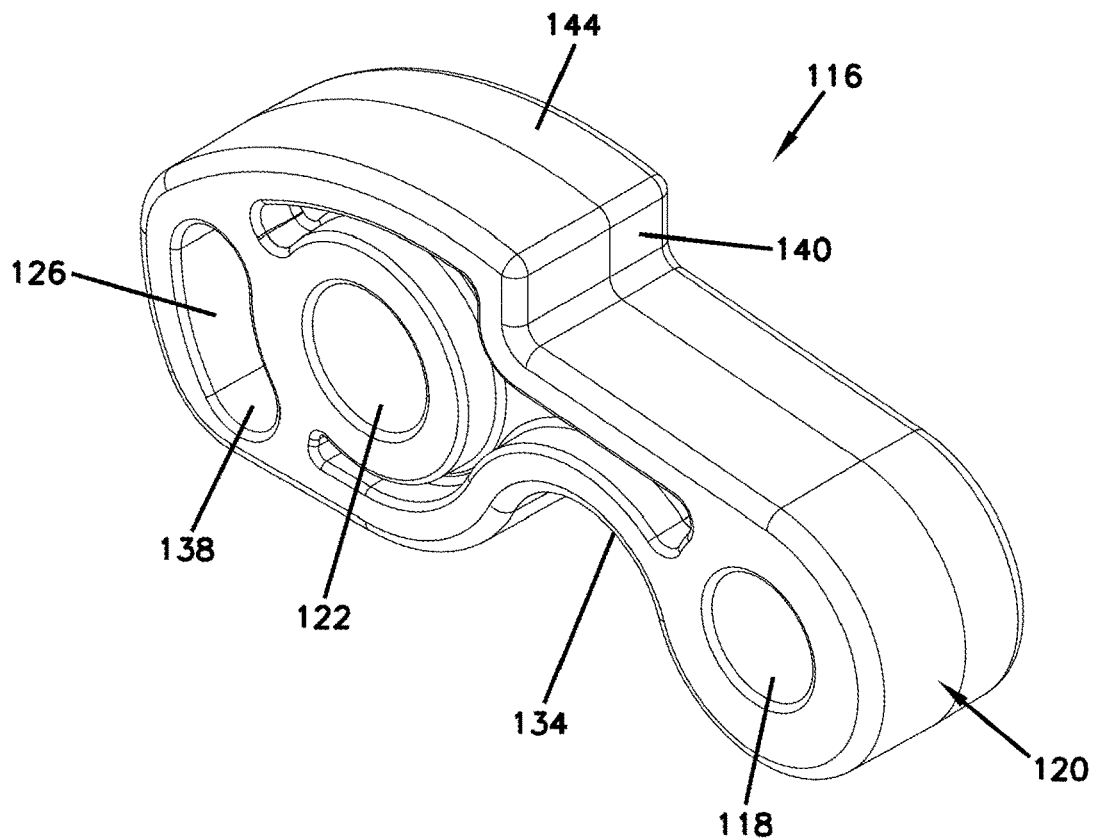
FIG. 19 is a front, top, left side perspective view of a hinge structure of the hinge assembly shown in FIGS. 12-18, the hinge structure shown in isolation.
Figure 20:
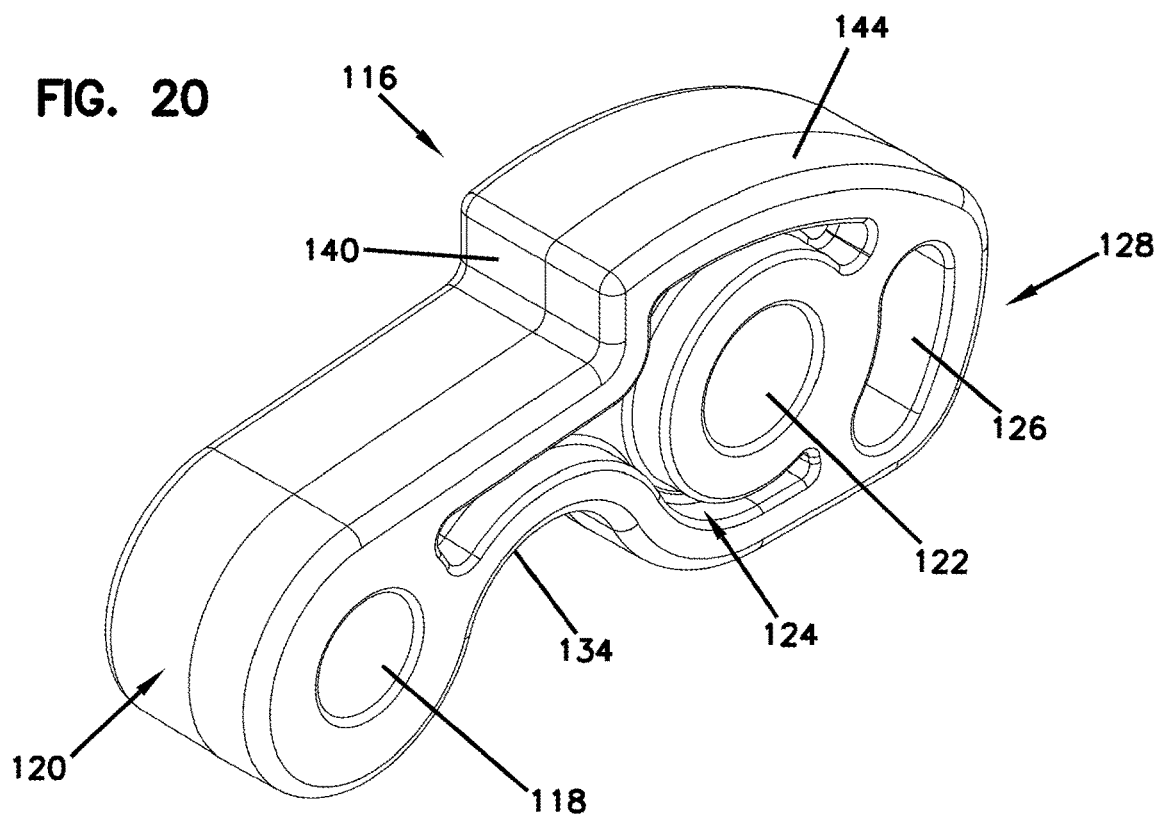
FIG. 20 is a front, top, right side perspective view of the hinge structure of FIG. 19.
Figure 21:
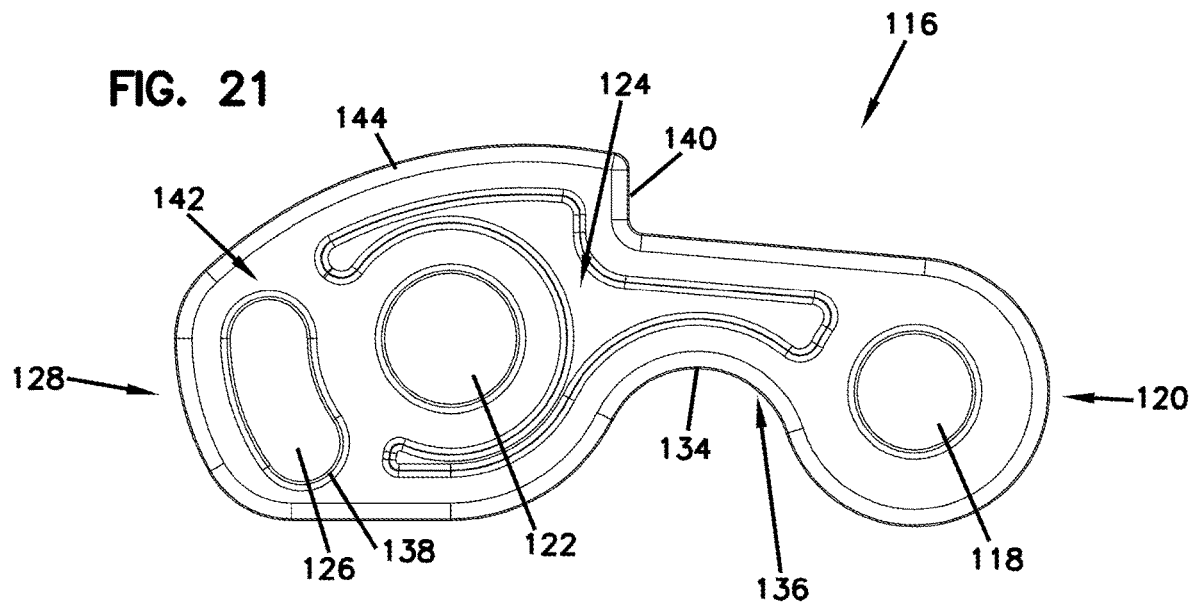
FIG. 21 is a side view of the hinge structure of FIG. 19.
Figure 22:
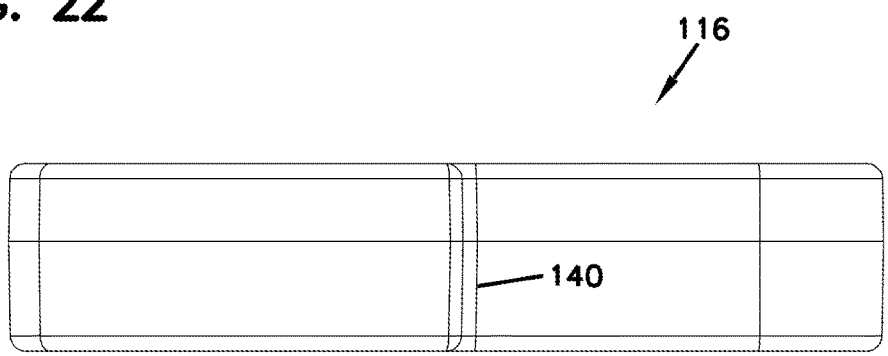
FIG. 22 is a top view of the hinge structure of FIG. 19.
Figure 23:
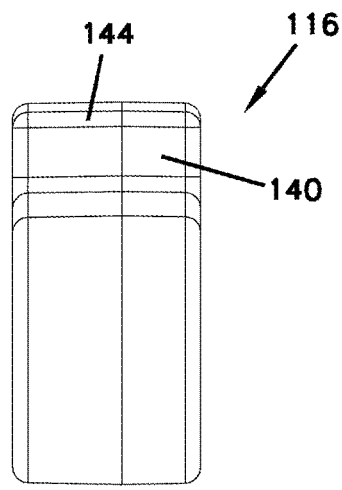
FIG. 23 is front view of the hinge structure of FIG. 19.

In FIGS. 17-18, the door assembly 100 and the hinge assembly 104 are shown as being used on an embodiment of a telecommunications chassis 146 that includes features such as the slidable trays 48 discussed above. In FIGS. 17-18, the depicted chassis 146 is shown with one of the trays 48 thereof in a stored position and one in an extended position, with the door 102 of the chassis 146 in a fully open position allowing extension of the sliding tray 48.

Figure 24:
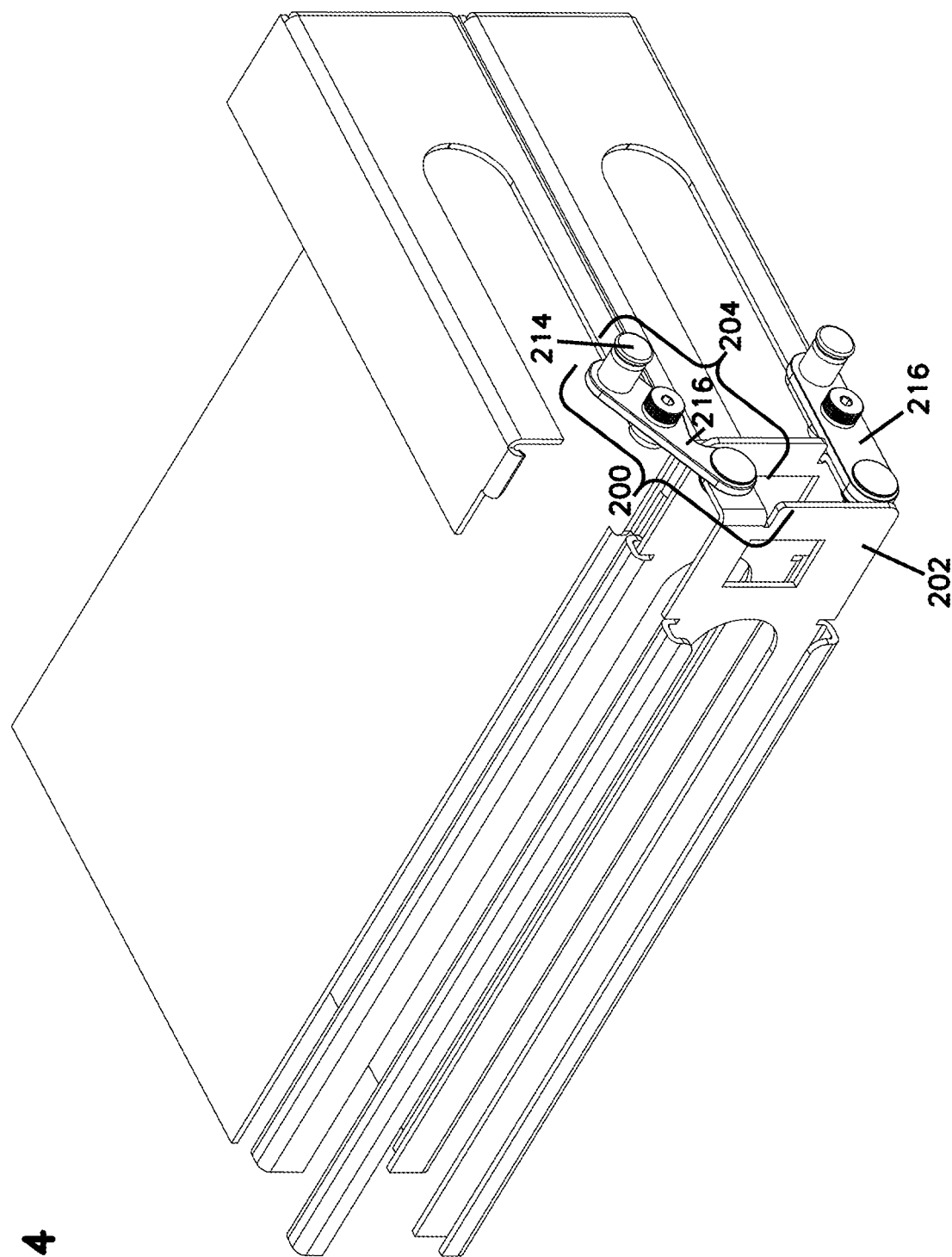
FIG. 24 illustrates a front, right side perspective view of a pair of door assemblies, each including another example of an inventive hinge assembly according to the present disclosure, the hinge assembly configured for mounting the door to a telecommunications fixture similar to the chassis shown in FIGS. 8, 10, and 11-18, wherein the upper door is shown in a fully open position.
Figure 25:
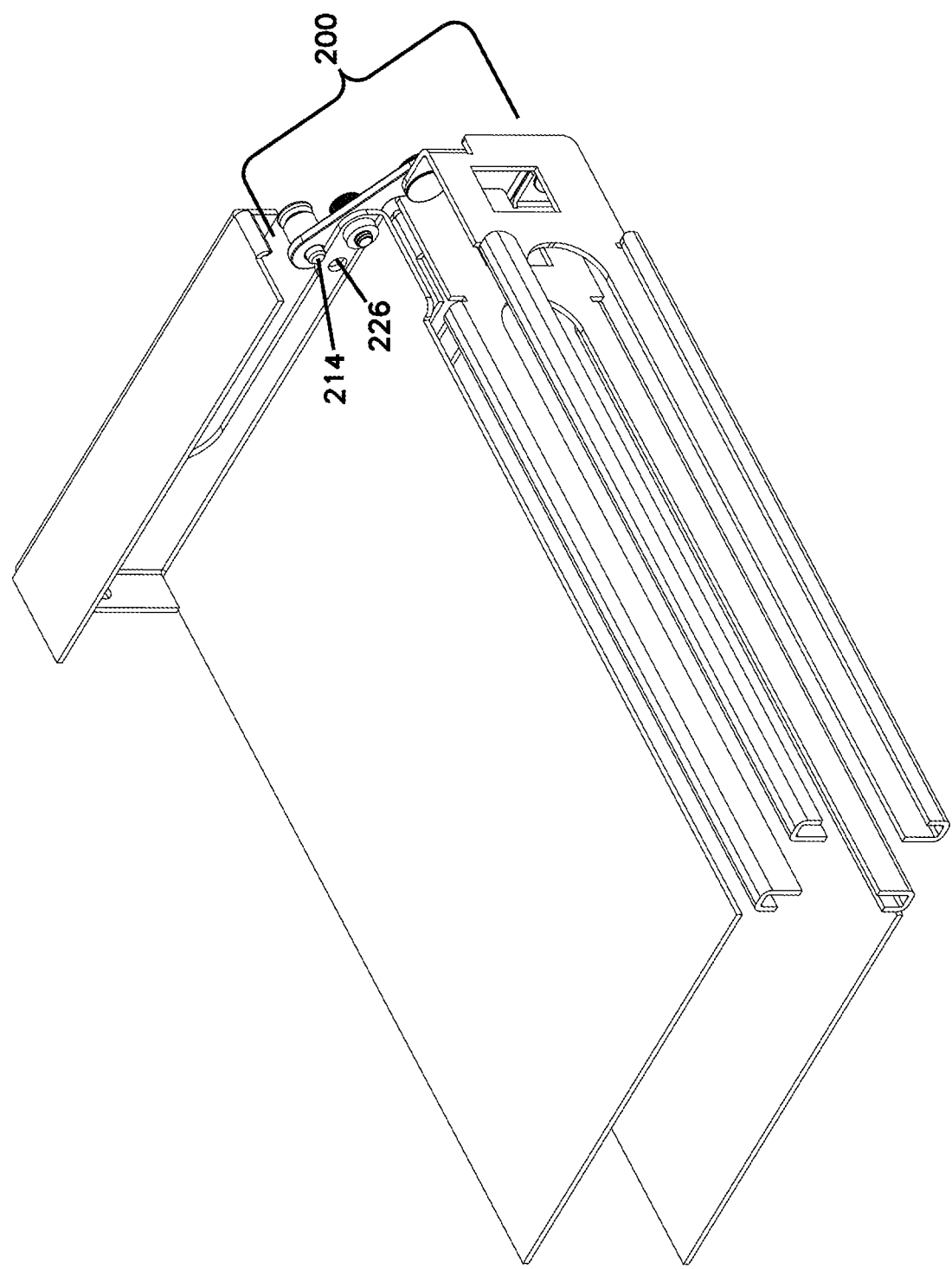
FIG. 25 illustrates the door assemblies of FIG. 24 from a front, left side perspective view.
Figure 26:
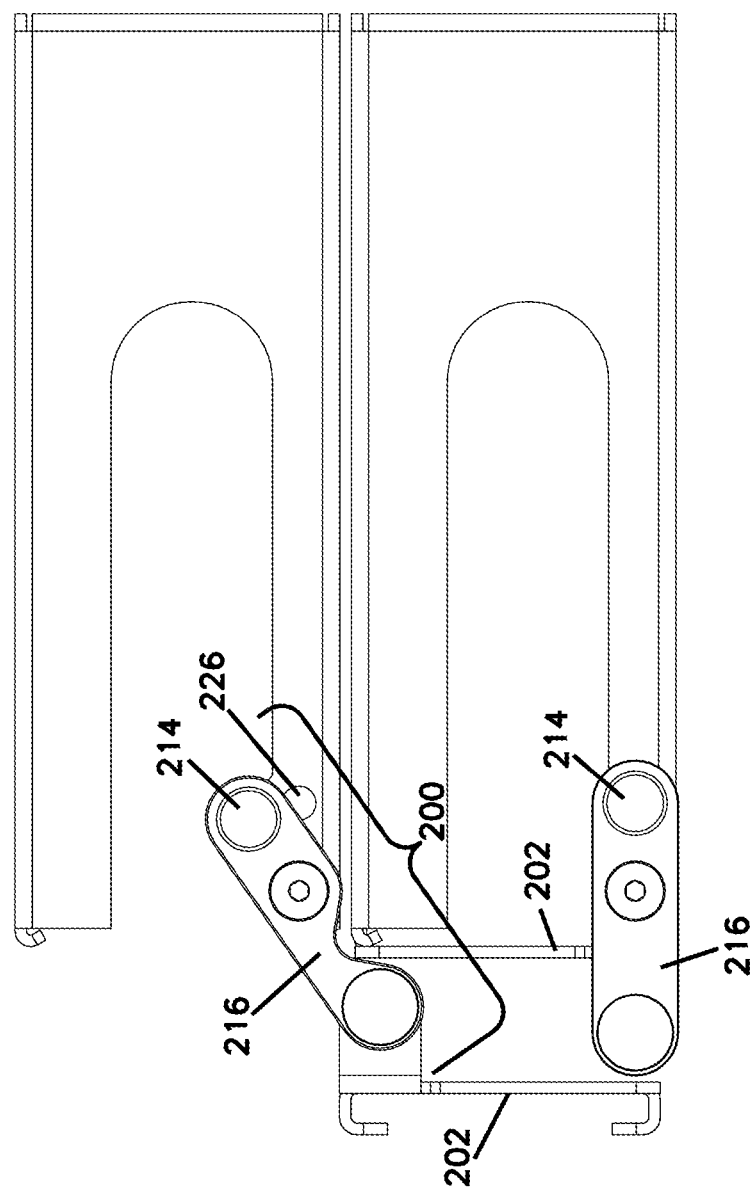
FIG. 26 illustrates the door assemblies of FIGS. 24-25 from a right side view.

Now referring to FIGS. 24-26, a door assembly 200 including another example of an inventive hinge assembly 204 according to the present disclosure is illustrated. FIG. 24 illustrates the door assembly 200 from a front, right side perspective view. FIG. 25 illustrates the door assembly 200 from a front, left side perspective view. And, FIG. 26 illustrates the door assembly 200 from a side view.

A majority of the configuration and functionality of the door assembly 100 of FIGS. 12-23 is shared by the door assembly 200 of FIGS. 24-26. Similar to the door assembly 100 of FIGS. 12-13, the door 202 of the door assembly 200 of FIGS. 24-26 also goes through multiple pivoting motions when being moved between the open and closed positions due to a similar combination hinge structure 216.

The hinge assembly 204 of FIGS. 24-26 is similar in structure and function to the hinge assembly 104 of FIGS. 12-23 described above except for a few differences. For example, as shown, the hinge structure 216 of the hinge assembly 204 of FIGS. 24-26 includes a spring-loaded pull-pin 214 that has to be pulled out and cleared from a pin opening 226 provided on the chassis before the hinge structure 216 can be pivoted. The pull-pin 214 and the pin opening 226 provide a variation on the hinge stop pin 114 and the hinge limit slot 126 features of the door assembly 100 of FIGS. 12-23. Whereas the hinge stop pin 114 and the hinge limit slot 126 features of the door assembly 100 of FIGS. 12-23 are in full interaction throughout the entire travel motion of the hinge structure 116 and limit the travel path of the hinge structure 116, the pull-pin 214 is simply used to unlatch the hinge structure 216 to provide for a further pivoting action for the hinge structure 216 in fully extending a tray out of the chassis in the embodiment of the door assembly 200 of FIGS. 24-26.

Similar to that provided by the hinge assembly 104 of FIGS. 12-23, if a piece of equipment inside the chassis needs to be accessed without necessarily removing a tray therefrom, the door 202 can simply be opened without the need for the further pivotal action of the hinge structure 216.

In the embodiment of the door assembly 200 of FIGS. 24-26, if the hinge structure 216 has been pivoted and the door 202 has been fully opened, then, when the door 202 is brought from the open position to the closed position, the pull-pin 214 has to be pulled out until the pin 214 is positioned in the pin opening 226 before the hinge structure 216, thus, the door 202, can be brought to the fully closed position.

Although in the foregoing description, terms such as "top," "bottom," "front," "back," "right," "left," "upper," and "lower" were used for ease of description and illustration, no restriction is intended by such use of the terms. The telecommunications devices described herein can be used in any orientation, depending upon the desired application.

Having described the preferred aspects and embodiments of the present disclosure, modifications and equivalents of the disclosed concepts may readily occur to one skilled in the art. However, it is intended that such modifications and equivalents be included within the scope of the claims which are appended hereto.

The invention claimed is:

1. A hinge assembly for pivotally coupling a door to a telecommunications chassis, the hinge assembly comprising:
a unitarily-formed one-piece hinge structure configured to attach the door to the telecommunications chassis, the hinge structure defining a door pivot point and a hinge pivot point that is spaced at a fixed distance from the door pivot point such that the distance between the door pivot point, where a door coupled by the hinge structure to the telecommunications chassis pivots relative to the hinge structure, and the hinge pivot point, where the hinge structure pivots relative to the telecommunications chassis, does not change, wherein the door coupled by the hinge structure to the telecommunications chassis can pivot with respect to the hinge structure independent of a pivoting motion of the hinge structure with respect to the telecommunications chassis,
wherein the hinge structure further defines at least a portion of a pivot limiting structure spaced from the hinge pivot point, the portion of the pivot limiting structure defined by the hinge structure being configured to interact with the telecommunications chassis in limiting the pivoting motion of the hinge structure, wherein the pivot limiting structure is defined by a slot formed on the hinge structure that is spaced from the hinge pivot point and that is also separate from and spaced from the door pivot point, wherein the slot defining the pivot limiting structure is configured to interact with a pin defined on the telecommunications chassis to limit the pivoting motion of the hinge structure, and wherein the hinge structure is configured such that when the door is at a fully closed position with respect to the telecommunications chassis, the door pivot point of the hinge structure is configured so as to be positioned forward of a vertical front face panel of the door, and when the door is at a fully open position with respect to the telecommunications chassis, the door pivot point of the hinge structure is configured so as to be positioned rearward of the vertical front face panel of the door.

2. The hinge assembly of claim 1, further comprising a fastener for removable mounting to the telecommunications chassis for keeping the hinge structure coupled to the chassis without interfering with the pivotal motion of the hinge structure.

3. The hinge assembly of claim 1, wherein the hinge structure defines a wall configured to be contacted by the door when bringing the door from the open position toward the closed position so as to start the pivoting motion of the hinge structure in a closing direction.

4. The hinge assembly of claim 1, wherein the hinge structure defines a cut-out configured to accommodate a similar door that is below the door coupled by the hinge structure when the door coupled by the hinge structure is in an open position.

5. The hinge assembly of claim 1, wherein at least a portion of the hinge structure defines a curved configuration to provide edge protection for optical fibers.

6. A telecommunications system comprising:
a telecommunications chassis; and
a door pivotally attached to the telecommunications chassis via a hinge assembly, the hinge assembly further comprising:
a unitarily-formed one-piece hinge structure extending between the telecommunications chassis and the door, the hinge structure defining a door pivot point and a hinge pivot point that is spaced at a fixed distance from the door pivot point such that the distance between the door pivot point, where the door coupled by the hinge assembly to the telecommunications chassis pivots relative to the hinge structure, and the hinge pivot point, where the hinge structure pivots relative to the telecommunications chassis, does not change, wherein the door coupled by the hinge assembly to the telecommunications chassis can pivot with respect to the hinge structure independent of a pivoting motion of the hinge structure with respect to the telecommunications chassis, wherein the hinge structure further defines at least a portion of a pivot limiting structure spaced from the hinge pivot point, the portion of the pivot limiting structure defined by the hinge structure being configured to interact with the telecommunications chassis in limiting the pivoting motion of the hinge structure, wherein the pivot limiting structure is defined by a slot formed on the hinge structure that is spaced from the hinge pivot point and that is also separate from and spaced from the door pivot point, wherein the slot defining the pivot limiting structure is configured to interact with a pin defined on the telecommunications chassis to limit the pivoting motion of the hinge structure, and wherein the hinge structure is configured such that when the door is at a fully closed position with respect to the telecommunications chassis, the door pivot point of the hinge structure is positioned forward of a vertical front face panel of the door, and when the door is at a fully open position with respect to the telecommunications chassis, the door pivot point of the hinge structure is positioned rearward of the vertical front face panel of the door.

7. The telecommunications system of claim 6, wherein the hinge assembly further comprises a fastener removably mounted to the telecommunications chassis for keeping the hinge structure coupled to the chassis without interfering with the pivotal motion of the hinge structure.

8. The telecommunications system of claim 6, wherein the hinge structure defines a wall configured to be contacted by the door when bringing the door from the open position toward the closed position so as to start the pivoting motion of the hinge structure in a closing direction.

9. The telecommunications system of claim 6, wherein the hinge structure defines a cut-out configured to accommodate a similar door that is below the door coupled by the hinge structure when the door coupled by the hinge structure is in the open position.

10. The telecommunications system of claim 6, wherein at least a portion of the hinge structure defines a curved configuration to provide edge protection for optical fibers.

* * * * *